United States Patent
Ohno et al.

(10) Patent No.: US 7,795,053 B2
(45) Date of Patent: Sep. 14, 2010

(54) LIGHT-EMITTING DEVICE MANUFACTURING METHOD AND LIGHT-EMITTING DEVICE

(75) Inventors: Eiji Ohno, Yanai (JP); Syoichi Takahashi, Yanai (JP); Mikiyoshi Kawamura, Yanai (JP); Minoru Yamamura, Yanai (JP); Tadashi Tamaki, Yanai (JP); Hayato Oba, Tokyo (JP); Masataka Kagiwada, Tokyo (JP); Hiroyuki Takayama, Tokyo (JP); Kei Teramura, Tokyo (JP); Atsushi Ohtaka, Yonezawa (JP); Toshiaki Morikawa, Yonezawa (JP)

(73) Assignees: Hitachi Cable Precision Co., Ltd, Yamagata (JP); Stanley Electric Co., Ltd., Tokyo (JP)

( * ) Notice: Subject to any disclaimer, the term of this patent is extended or adjusted under 35 U.S.C. 154(b) by 775 days.

(21) Appl. No.: 10/592,006

(22) PCT Filed: Mar. 24, 2004

(86) PCT No.: PCT/JP2004/004092
§ 371 (c)(1),
(2), (4) Date: May 11, 2007

(87) PCT Pub. No.: WO2005/091383
PCT Pub. Date: Sep. 29, 2005

(65) Prior Publication Data
US 2007/0278511 A1    Dec. 6, 2007

(51) Int. Cl.
*H01L 21/00* (2006.01)
(52) U.S. Cl. .......... 438/26; 438/25; 257/E33.056; 257/E33.059; 257/E33.066
(58) Field of Classification Search ........... 438/25, 438/26, 106; 257/99, E33.056–E33.059, 257/E33.066
See application file for complete search history.

(56) References Cited

U.S. PATENT DOCUMENTS

| 6,274,890 B1 * | 8/2001 | Oshio et al. ............ 257/98 |
| 2002/0084518 A1 * | 7/2002 | Hasebe et al. ............ 257/676 |

FOREIGN PATENT DOCUMENTS

JP    5-11470    7/1991

(Continued)

OTHER PUBLICATIONS

International Search Report of PCT/JP2004/004092 mailed Jul. 6, 2004.

*Primary Examiner*—Ha Tran T Nguyen
*Assistant Examiner*—Daniel Whalen
(74) *Attorney, Agent, or Firm*—Stites & Harbison PLLC; Juan Carlos A. Marquez, Esq.

(57) ABSTRACT

A method for producing a light-emitting device comprising: a step of electrically connecting a first electrode provided on one main surface of a semiconductor substrate (element substrate) through a light-emitting layer, and a first lead of a lead frame, so as to oppose each other; a step of electrically connecting a second electrode provided on the rear surface of a surface provided with the light-emitting layer of said element substrate, and a second lead of the above-described lead frame; a step of encapsulating a connecting part of said first electrode and said first lead, and said second electrode, and an electrode part of the second lead, with a transparent resin; and a step of producing a discrete edge by cutting said first lead and the second lead from said lead frame; wherein a film of joining material (joining material film) made of an alloy or a single metal, is formed on the first electrode of said light-emitting element, and a pattern to reduce spreading of said joining material is formed on an element mounting part of said first lead, in advance of the step of electrically connecting the first electrode of said light-emitting element and said first lead, to reduce amount of the joining material flowing outside of a joining area wherein the first electrode is placed.

12 Claims, 19 Drawing Sheets

U.S. PATENT DOCUMENTS

| | | |
|---|---|---|
| JP | 5-63242 | 8/1991 |
| JP | 5-48366 | 11/1991 |
| JP | 05063242 * | 3/1993 |
| JP | 7-38208 | 7/1993 |
| JP | 2000-261085 | 3/1999 |
| JP | 2001-230498 | 2/2000 |
| JP | 2001-352100 | 6/2000 |
| JP | 2003-174200 | 12/2001 |
| JP | 2003-174201 | 12/2001 |
| JP | 2001352100 * | 12/2001 |

* cited by examiner

US 7,795,053 B2

LIGHT-EMITTING DEVICE MANUFACTURING METHOD AND LIGHT-EMITTING DEVICE

TECHNICAL FIELD

The present invention relates to a method for producing a light-emitting device and a light-emitting device, and in particular, relates to effective technology to be applied to a light-emitting device in which a light-emitting layer side provided on a semiconductor substrate (element substrate) is mounted (joined) as opposing to a lead frame.

BACKGROUND ART

There has conventionally been a light-emitting device using a light-emitting element provided with a light-emitting layer on one main surface of a semiconductor substrate, such as LED (Light Emitting Diode) and LD (Laser Diode). When the light-emitting device is produced, a lead frame having an opening part, with the first lead electrically connected with one electrode of the light-emitting element, and the second lead electrically connected with the other electrode, both projecting to the opening part, is used. In this case, for example, an element mounting part to mount the light-emitting element is provided on the first lead of the lead frame. And one electrode of the light-emitting element and the element mounting part are bonded so as to oppose each other, by conductive adhesive such as a silver-paste, and the other electrode is connected to the second lead by a bonding wire, and the like.

When one electrode of the light-emitting element and the element mounting part (lead) are bonded, as a method for preventing short circuit of an element or light blocking caused by a conductive adhesive flowing outside a bonding area wherein the electrode of the light-emitting element is placed, there is a method, for example, for providing a bonding part of the light-emitting element with a convex chip-mounting part having an upper surface with area equal to or smaller than the bonding area of the light-emitting element, as described in JP-A-5-63242 (hereinafter referred to as Reference 1). In this method, for example, as shown in FIG. 1 of Reference 1, conductive adhesive is dropped on the mounting part, and then a light-emitting diode chip (light-emitting element) is placed on the conductive adhesive dropped, and pressure-bonded. In this pressure-bonding, excess conductive adhesive is extruded from between the light-emitting diode chip and the light-emitting diode chip-mounting part, however, the overflowing conductive adhesive flows into a lower part surrounding the mounting part because the mounting part has convex shape, which enables to prevent a bond from heaping up on the mounting part, or from contacting with the end surface of the light-emitting diode chip.

As a method for preventing short circuit of an element or light blocking caused by a conductive adhesive flowing outside the bonding area, besides the method described in Reference 1, for example, as described in JP-A-2001-352100 (hereinafter referred to as Reference 2), there is a method for providing a bonding part of the light-emitting element with at least two concave grooves at least in the same direction to keep the conductive adhesive in the concave grooves. In this method, for example, as shown in FIGS. 1(a) and 1(b) of Reference 2, a plurality of striped concave grooves are formed on the bottom surface of a cup-shaped concave part formed at the tip of the first lead, and bonding material is retained in the concave grooves. In this state, even if bonding material is sufficiently applied to ensure bonding of the LED chip (light-emitting element), most of the bonding material is received in the concave grooves, and the bonding material remains only slightly on the surface, and practically does not heap up. Therefore, even when an LED chip is provided thereon, the bonding material hardly climbs up extremely on the side surface of the LED chip substrate.

DISCLOSURE OF INVENTION

When the above-described light-emitting element is a high-intensity LED, and the like, heat generated in a light-emitting layer is necessary to efficiently be radiated outside of the device to prevent deterioration of light-emitting characteristics. In this case, by opposing the light-emitting layer side to a lead, heat in the light-emitting layer can efficiently be transmitted to the lead, and be radiated outside of the device.

When an electrode of the light-emitting element and a lead are connected by a bonding wire, it is required to apply load and vibration. Therefore, if a light-emitting layer is located just under an electrode to be connected by the bonding wire, the light-emitting layer may receive damage due to the load or the vibration, and light-emitting efficiency may sometimes be lowered.

When a translucent element substrate is used, bonding of an electrode of a light-emitting layer side and the lead as opposed each other, with the conductive adhesive, makes distance long between the light-emitting layer, and the electrode formed on a substrate or a bonding wire. Therefore, ratio of light blocked by the electrode or the bonding wire to light emitted from the light-emitting layer can be reduced, and light-emitting efficiency can further be improved.

For these reasons, an electrode at the light-emitting layer side of the light-emitting device has recently been bonded with the lead as opposing each other, by the conductive adhesive.

However, in a mounting method of a light-emitting element described in Reference 1, paste-like and fluid conductive adhesive such as a silver paste is used. Therefore when conductive adhesive is dropped on the mounting part, it is difficult to drop appropriate amount of the conductive adhesive only on the mounting part, and the conductive adhesive may flow down to the surrounding area of the mounting part, or heap up thick on the mounting part. The present inventors have independently studied that bonding of the electrode of the light-emitting layer side of the light-emitting element in the way described above, may pose a problem that the conductive adhesive which flows down to the surrounding area of the mounting part and overflows from the mounting part, climbs up along the side surface of the light-emitting layer and blocks light emitted from the light-emitting layer.

Also in the die bonding method of a light-emitting element, described in Reference 2, the paste-like, fluid bonding material is used. Therefore, when the bonding material is applied, the bonding material (conductive adhesive) may sometimes spread outside of the bonding area where the electrode of the light-emitting element is placed. In addition, if depth (volume) of the grooves is not sufficient, thickness of the conductive adhesive remaining on the lead surface becomes large. In this case as well, the present inventors have independently studied that bonding of the electrode of the light-emitting layer side of the light-emitting element in the way described above, may pose a problem that the conductive adhesive spreading outside of the bonding area, climbs up along the side surface of the light-emitting layer and blocks light emitted from the light-emitting layer.

Inventors studied on their own that, because thickness of the light-emitting layer in the light-emitting element is approximately several μm, it may also pose a problem that the conductive adhesive, climbing up along the side surface of the light-emitting layer beyond the light-emitting layer, reaches up to the side surface of the element substrate provided with the other electrode, and causes short circuit.

As described above, in the case of connecting the electrode of the light-emitting element and the first lead, using conductive adhesive which is fluid and past-like at room temperature, such as the silver paste, it is difficult to control thickness and the bonding area in applying or dropping. Therefore, in a conventional method for producing a light-emitting device, in the case of bonding the light-emitting element, there is a problem in that a portion of the bond being already outside of the bonding area where the light-emitting element is placed, and the bond flowing outward due to load application, climb up along the side surface of the light-emitting element, and cause short circuit and blocking of light emitted from the light-emitting layer. In addition, in the case of conductive adhesive being fluid at room temperature, like the silver paste, large variation in the application amount may also pose a problem of defective bonding caused by insufficient application amount.

In a conventional method for producing a light-emitting device, the electrode of the light-emitting element and the lead are bonded by using conductive adhesive such as a silver paste, and are electrically connected as well. The silver paste is, for example, a bond based on an epoxy resin diffused with silver particles, and it is impossible to take a complete metal bonding (ohmic contact) with the electrode or lead. Therefore there is a problem of difficulty in enhancement of brightness of a light-emitting device due to inability of high-current passing.

It is an object of the present invention to prevent bonding material from climbing up along the side surface of the light-emitting element and causing short circuit, in electrically connecting an electrode of a light-emitting layer side of a light-emitting element with a lead of a lead frame, as opposing each other.

And it is also an object of the present invention to easily enhance brightness of the light-emitting device.

Other objectives and novel features of the present invention will be better understood from the description of the present specification and the attached drawings.

To accomplish the above-mentioned objectives, the present invention provides a method for producing a light-emitting device comprising:

a step of electrically connecting a first electrode provided on one main surface of a semiconductor substrate (element substrate) through a light-emitting layer, and a first lead of a lead frame, so as to oppose each other; a step of electrically connecting a second electrode provided on the rear surface of a surface provided with the light-emitting layer of the above-described element substrate, and a second lead of the above-described lead frame; a step of encapsulating a connecting part of the above-described first electrode and the above-described first lead, and the above-described second electrode, and an electrode part of the second lead, with a transparent resin; and a step of producing a discrete edge by cutting the above-described first lead and the second lead from the above-described lead frame; wherein a film of joining material (joining material film) made of an alloy or a single metal, is formed on the first electrode of the above-described light-emitting element, and a pattern to reduce spreading of the above-described joining material is formed on an element mounting part of the above-described first lead, in advance of the step of electrically connecting the first electrode of the above-described light-emitting element and the above-described first lead.

The joining material film here may be formed when the light-emitting device is produced, or just prior to the step of electrically connecting the first electrode and the first lead. Correspondingly, the pattern of the lead frame may be formed when the lead frame is produced, or just prior to the step of electrically connecting the first electrode and the first lead.

The joining material film may be formed in advance by utilization of a film forming technology such as vapor deposition, sputtering or plating, or a thin film formed in advance may be attached on the first electrode. When the joining material film is formed by these methods, thickness variation of the joining material film is reduced, because control of film thickness is easy. And preferably metal material with melting point higher than that of solder joining material used for surface mounting of the light-emitting device on a printed circuit board, and the like, be used as the joining material film. As such joining material, for example, a gold-tin alloy (AuSn) is included.

In the case of connecting the first electrode and the first lead by using the joining material, if the connecting surface of the first lead is flat, the melted or softened joining material spreads out outside a joining area wherein the first electrode is placed, because load is applied and/or minute vibration is added while the joining material is in molten or softened state. Therefore, a pattern with grooves having a plurality of crosspoints or with a concave portion having a plurality of insular protrusions, is formed in advance on the element mounting part of the first lead, as a pattern to reduce spreading of the joining material. By the above method, it is possible to reduce amount of the joining material spreading out outside of the joining area, because the joining material spreading out outside the joining area, flows into the grooves or the concave portion.

In the case of forming the grooves on the element mounting part of the first lead, the grooves extending from the inside to the outside of the joining area wherein the first electrode is placed, are formed. By the above method, when the molten or softened joining material flows into the grooves, it is possible to efficiently exhaust air or gas present in the grooves, and to prevent air bubbles or cavities from remaining in the grooves of the joining area. Therefore, deterioration of joining strength, thermal conductivity and electric conductivity can be reduced. If pluralities of grooves are formed in crossing way, the joining material collides mutually at the crosspoints, when the joining material, flowing into the grooves, spreads outward, and the joining material flowing outward, is restricted. As examples of such grooves, for example, grid-like grooves, a mixed pattern of radiating grooves and annular grooves, and the like are included.

When a concave portion, having a plurality of insular protrusion portions, is formed on the element mounting part of the first lead, a concave portion is formed so that the entire periphery or a part of the periphery thereof is located outside the circumference (joining area) of the first electrode. In this way, when the molten or softened joining material flows into the concave portion, it is possible to efficiently exhaust air or gas in the grooves and to prevent air bubbles or cavities from remaining in the grooves of the joining area, which in turn enables to prevent lowering of joining strength, thermal conductivity and electric conductivity. And if the protrusion portions have the flat upper surfaces, as surface area closer to the first lead becomes large, it is possible to prevent the element from inclining, because of high stability in mounting the light-emitting element. And heat conduction from the light-emitting element to the first lead becomes efficient. As examples of such a concave portion, for example, a concave portion having each of the protrusion portions arranged in hound's-tooth check, and a concave portion having a plurality of concave portions connected by narrow vent grooves, are included.

In addition, by providing the element mounting part of the first lead with a concave portion having grooves or a plurality of convex portions, thermal stress caused by heating in connecting can be dispersed. Therefore, crack generated in the light-emitting element, and the like can be reduced, by using a compound semiconductor including GaAs, as the element substrate.

In addition, a light-emitting device produced according to the above-described method, can take complete metal bonding (ohmic contact) both between the first electrode and the joining material, and the joining material and the first lead. Therefore higher current can be passed compared with the case of using conductive adhesive such as a conventional silver paste, which in turn enhances brightness of the light-emitting device. When high-current is passed to the light-emitting device, use of copper material is preferable, as the lead frame, in view of electric characteristics and heat radiation.

BRIEF DESCRIPTION OF THE DRAWINGS

FIG. 1(a) is a plan view of a light-emitting element as viewed from a light-emitting layer side; and FIG. 1(b) is a cross-sectional view along A-A line in FIG. 1(a).

FIG. 2(a) shows a constitution example of a light-emitting layer of FIG. 1(b); and FIG. 2(b) shows another constitution example of a light-emitting layer of FIG. 1(b).

FIG. 3(a) is a plan view of a light-emitting device as viewed in a light-emitting direction; FIG. 3(b) is a cross-sectional view along B-B line in FIG. 3(a); and FIG. 3(c) is a magnified cross-sectional view of a joining part of the first electrode of a light-emitting element and the first lead.

FIG. 4(a) is a plan view of a constitution of an element mounting part of the first lead; FIG. 4(b) is a cross-sectional view along C-C line in FIG. 4(a); and FIG. 4(c) is a sectional view along D-D line in FIG. 3(a).

FIG. 5(a) is a plan view showing a constitution of a lead frame; and FIG. 5(b) is a sectional view of a step of electrically connecting the first electrode of a light-emitting element and the first lead.

FIG. 8(a) is a cross-sectional view of a step of electrically connecting the second electrode of a light-emitting element and the second lead; and FIG. 8(b) shows a step of encapsulating with a transparent resin.

FIG. 9(a) explains action thereof; FIG. 9(b) explains a method for surface mounting on a printed circuit board; and FIG. 9(c) explains a deformation example of an outer shape of a transparent resin.

FIG. 10(a) is a plan view of a step of opening a conductive plate; FIG. 10(b) is a cross-sectional view along E-E line in FIG. 10(a); and FIG. 10(c) is a cross-sectional view of a step of forming an element mounting part into a cup-shape.

FIG. 11(a) is a cross-sectional view of a step of bending a protrusion portion; and FIGS. 11(b) and 11(c) are a cross-sectional view and a plan view of a step of forming grooves on the inner-bottom surface of an element mounting part, respectively.

FIG. 15(a) is a plan view showing a constitution of a concave portion provided with an insular convex portion; and FIG. 15(b) is a cross-sectional view along F-F line in FIG. 15(a).

BEST MODES FOR CARRYING OUT THE PRESENT INVENTION

In a method for producing a light-emitting device of the present invention, in electrically connecting an electrode on the light-emitting layer of a light-emitting element provided with the light-emitting layer on one main surface of a semiconductor substrate (element substrate), and a lead of a lead frame, as opposing each other, a film of a joining material (joining material film) made of an alloy or a single metal is formed in advance on the electrode side of the light-emitting layer. In addition, a pattern to reduce spreading amount of joining material outward from a periphery of the electrode of the light-emitting layer, is formed in advance on an element mounting part of the lead to be connected with the electrode on the light-emitting layer.

Figure 1A:
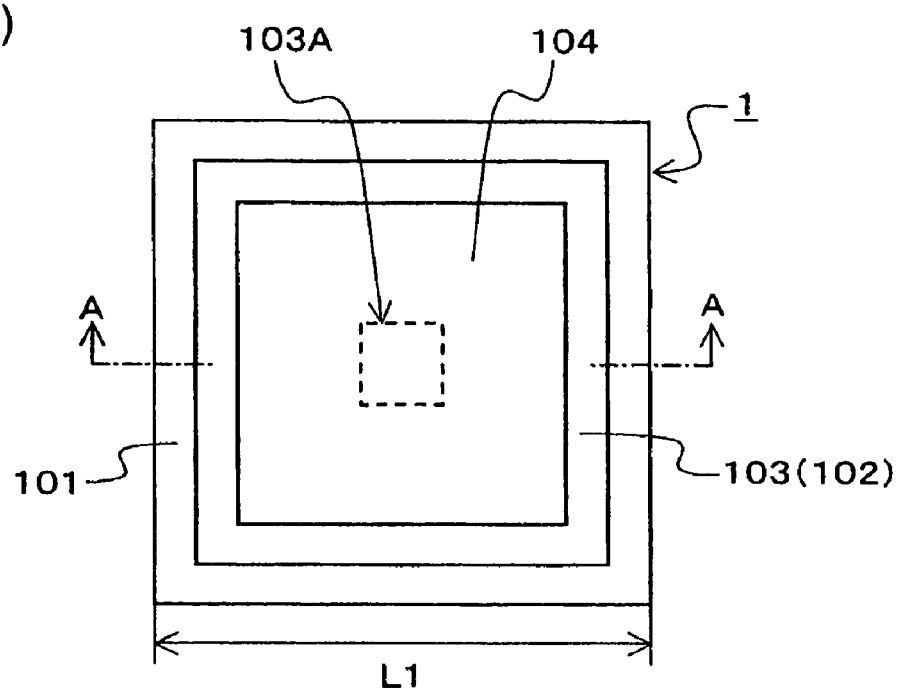
FIGS. 1(a) and 1(b) are schematic views showing general constitutions of a light-emitting element relevant to the present invention.
Figure 1B:
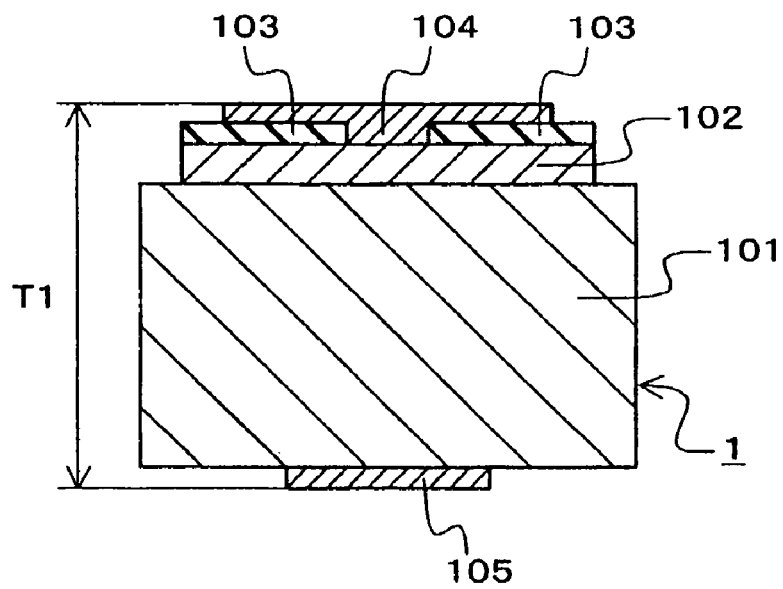
Figure 2A:
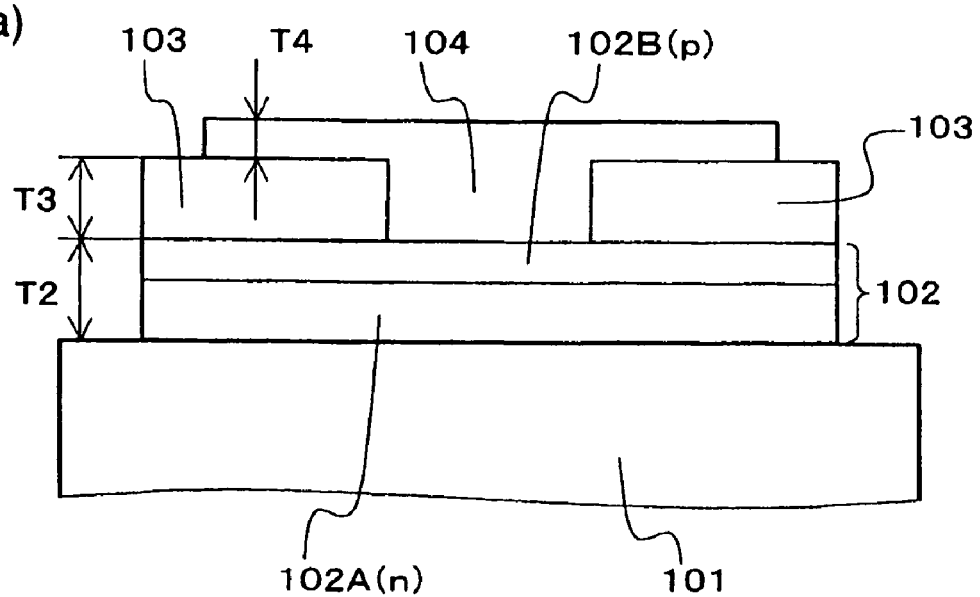
FIGS. 2(a) and 2(b) are schematic views showing general constitutions of a light-emitting device relevant to the present invention.

FIGS. 1(a), 1(b), 2(a), and 2(b) are schematic views showing general constitutions of a light-emitting element relevant to the present invention; FIG. 1(a) is a plan view of a light-emitting element as viewed from a light-emitting layer side; FIG. 1(b) is a cross-sectional view along A-A line in FIG. 1(a); FIG. 2(a) explains a constitution example of the light-emitting layer; and FIG. 2(b) explains another constitution example of a light-emitting layer.

Figure 2B:
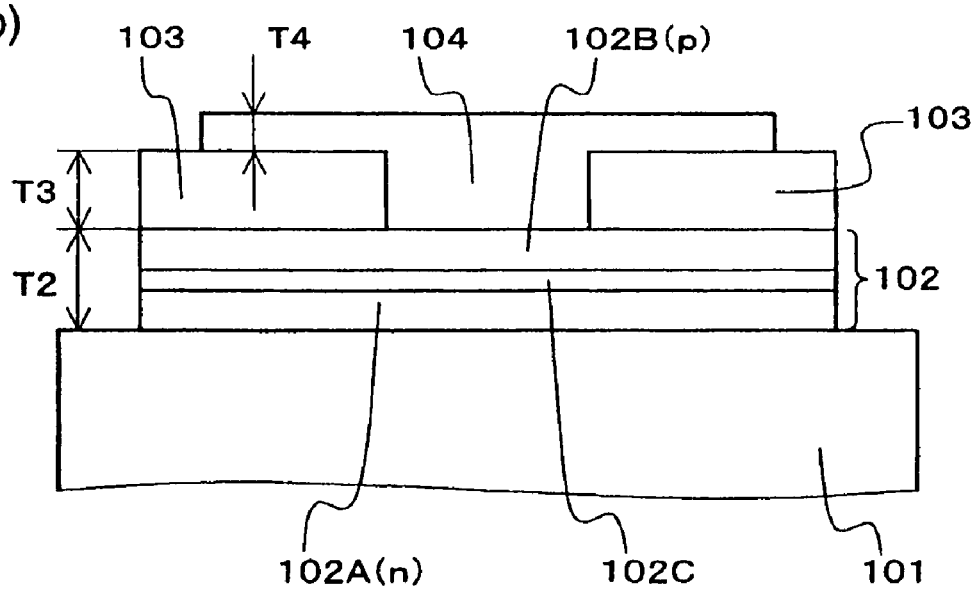

In FIGS. 1(a) and 1(b), 1 is a light-emitting element, 101 is a semiconductor substrate (element substrate), 102 is a light-emitting layer, 103 is an insulator film, 103A is a contact-hole, 104 is the first electrode and 105 is the second electrode. In each of FIGS. 2(a) and 2(b), 102(a) is an n-type semiconductor layer and 102B is a p-type semiconductor layer. And in FIG. 2(b), 102C is an active layer.

A light-emitting element 1 relevant to the present invention, for example, is a light-emitting element such as LED and LD, and the light-emitting layer 102 is provided on one main surface of the semiconductor substrate (element substrate) 101 as shown in FIGS. 1(a) and 1(b). In addition, the first electrode 104 electrically connected to the light-emitting layer, through the insulator film 103 having an opening (contact-hole) 103A, is provided on the light-emitting layer 102. Further, the second electrode 105 is provided on the rear surface of the surface mounted with the light-emitting layer 102 of the element substrate 101. In this case, the element substrate 101 is made of material such as GaAs, GaN, sapphire ($Al_2O_3$) and SiC. In particular, by using an element substrate having high translucency, light-emitting efficiency can be much improved, because a portion of light emitted from the light-emitting layer 102 is emitted outward through the translucent element substrate. In addition, in the light-emitting element 1, a plain shape view of an outer shape of a chip (element substrate 101) is a square or a rectangular with a side length L1 thereof being 100 to 1000 μm and the light-emitting element has a thickness T1 of 20 to 400 μm.

When the light-emitting element 1 is LED, the light-emitting layer 102 is generally a homo junction, for example, as shown in FIG. 2(a), an n-type semiconductor layer 102A and a p-type semiconductor layer 102B are laminated in this order from the element substrate 101 side. In this case, as the light-emitting layer 102 also emits light from the side surface, the side surface is exposed. When the light-emitting element 1 is a red LED, for example, the element substrate 101 is made of GaAs, and the n-type semiconductor layer 102A and the p-type semiconductor layer 102B are made of n-type AlGaAs and p-type AlGaAs, respectively. In addition, the insulator film 103, for example, is made of $SiO_2$ and the first electrode 104 and the second electrode 105 are made of nickel (Ni). In this case, thickness T2 of the light-emitting layer 102 is infinitely thinner compared with that of the element substrate 101 and, for example, about 1 μm. And thickness T3 of the insulator film 103, and thickness T4 of the first electrode 104 on the insulator film 103 are also infinitely thinner compared with that of the element substrate 101, and approximately 1 μm and 0.5 μm, respectively.

When the light-emitting element 1 is a high-intensity LED or LD, the light-emitting layer 102 takes double-hetero-structure and, for example, as shown in FIG. 2(b), a narrow band-gap active layer 102C is provided between a wide band-gap n-type semiconductor layer 102A and a p-type semiconductor layer 102B. In this case, the side surface of the light-emitting layer 102 is also exposed. In the case of such a light-emitting element 1, for example, the element substrate 101 is made of GaAs, and the n-type semiconductor layer 102A, the p-type semiconductor layer 102B, and the active layer 102C are made of n-type AlGaAs, p-type AlGaAs and GaAs, respectively. In addition, the insulator film 103 is made of, for example, $SiO_2$ and the first electrode 104 and the second electrode 105 are made of nickel (Ni). In this case thickness T2 of the light-emitting layer 102 is infinitely thinner compared with that of the element substrate 101, and, for example, about 1 μm. And thickness T3 of the insulator film 103 and thickness T4 of the first electrode 104 on the insulator film 103 are also infinitely thinner compared with that of the element substrate 101, and approximately 1 μm and 0.5 μm, respectively.

These constitutions herein are only examples of constitutions of the light-emitting element 1, and the present invention should not be limited only to any of these constitutions.

EMBODIMENTS

Figure 3A:
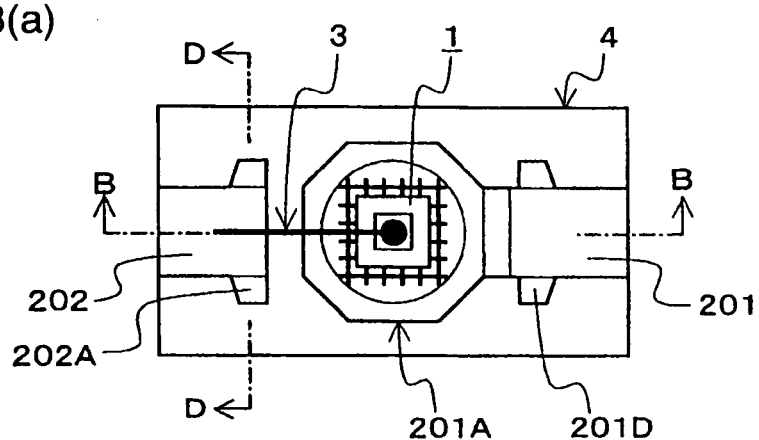
FIGS. 3(a), 3(b), and 3(c) are schematic views showing general constitutions of a light-emitting device of the present embodiment.
Figure 3B:
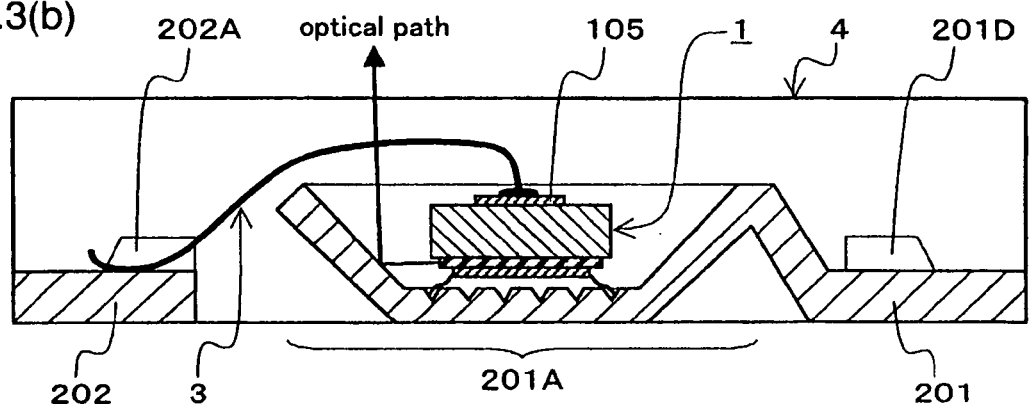
Figure 3C:
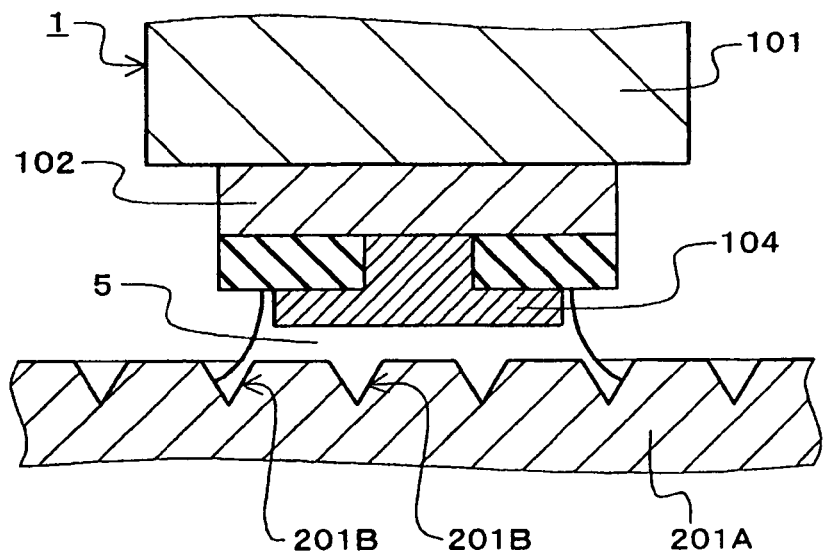
Figure 4A:
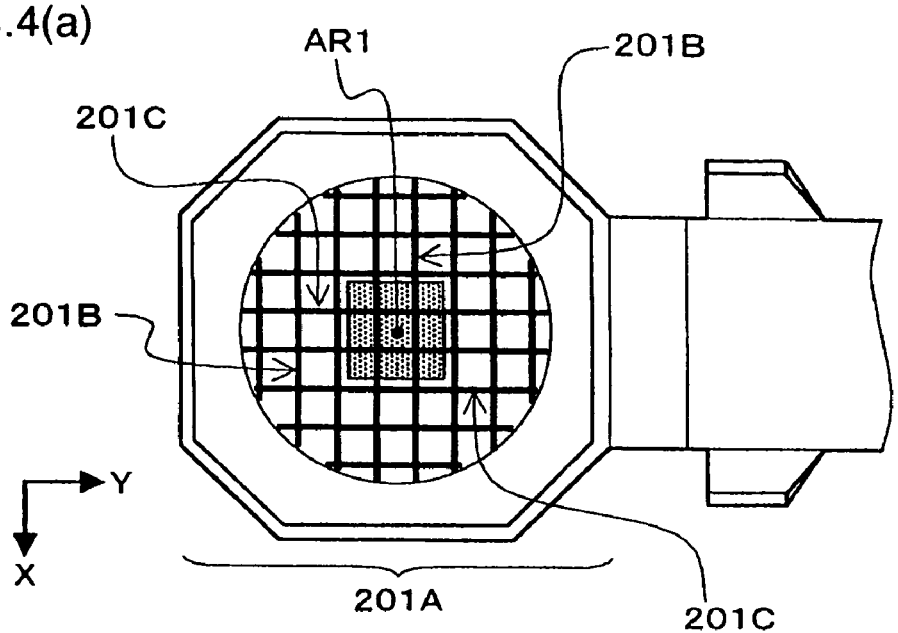
FIGS. 4(a), 4(b), and 4(c) are schematic views showing general constitutions of a light-emitting device of an embodiment according to the present invention.
Figure 4B:
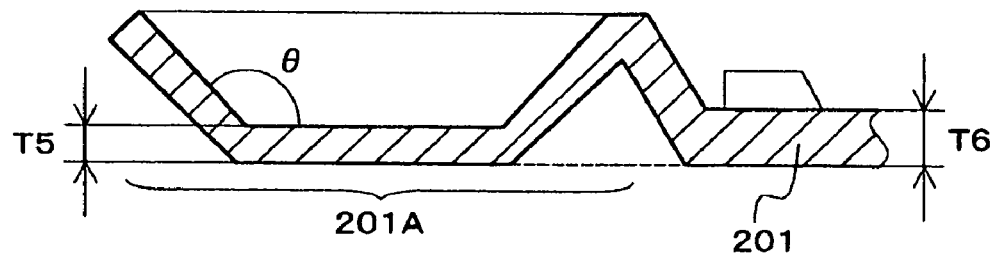
Figure 4C:
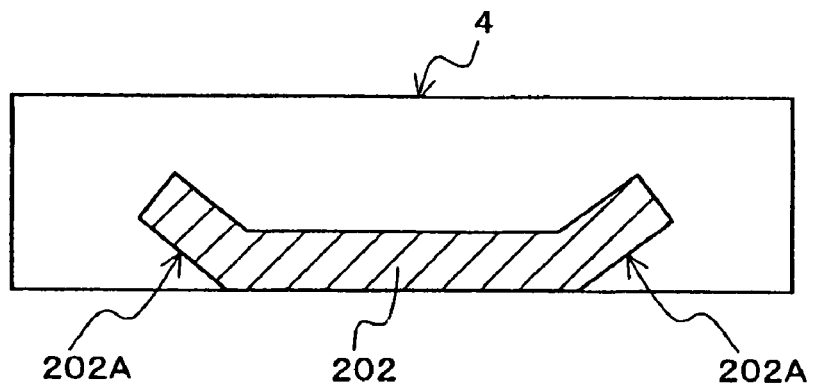

FIGS. 3(a), 3(b), 3(c), 4(a), 4(b), and 4(c) are schematic views showing general constitutions of a light-emitting device according to the embodiment of the present invention; FIG. 3(a) is a plan view of a light-emitting device as viewed in a light-emitting direction; FIG. 3(b) is a cross-sectional view along B-B line in FIG. 3(a); FIG. 3(c) is a magnified cross-sectional view of the joining part of the first electrode of a light-emitting element and the first lead; FIG. 4(a) is a plan view showing a constitution of an element mounting part of the first lead; FIG. 4(b) is a cross-sectional view along C-C line in FIG. 4(a); and FIG. 4(c) is a sectional view along D-D line in FIG. 3(a).

In each of FIGS. 3(a), 3(b), 3(c), 4(a), 4(b), and 4(c), 201 is the first lead, 201A is an element mounting part, 201B and 201C are grooves, 201D is a protruding portion as preventive measures for dropping, 202 is the second lead, 202A is a protruding portion as preventive measures for dropping, 3 is a bonding wire, 4 is a transparent resin and 5 is joining material.

A light-emitting device of the present embodiment is composed of, as shown in FIG. 3(a) and FIG. 3(b), the light-emitting element 1, the first lead 201 having the element mounting part 201A where the light-emitting element 1 is provided, the second lead 202 electrically connected to the second electrode 105 of the light-emitting element 1 with the bonding wire 3, and the transparent resin 4 encapsulating the surrounding of the light-emitting element 1.

And the first lead 201 is formed into a cup-shape with the element mounting part 201A having a flat bottom surface, and the light-emitting element 1 is provided in the cup-shaped portion. In this case, the light-emitting element 1 is provided, for example, with the first electrode 104 side, i.e. the light-emitting layer 102 side, opposing to the element mounting part 201A, as shown in FIG. 3(c), and the first electrode 104 and the element mounting part 201A are electrically connected by the joining material 5 made of an alloy or a single metal. In the present embodiment, the above-described joining material 5 is a gold-tin (AuSn) alloy, as an example.

Furthermore, the element mounting part 201A is provided with grid-like grooves 201B and 201C, extending to the outside from the inner part of a joining area AR1 wherein the first electrode 104 of the light-emitting element 1 is placed, as shown in FIGS. 3(c) and 4(a). And the grid-like grooves 201B and 201C, are provided in such space that pluralities of crosspoints are present within the joining part AR1.

And in the first lead 201, thickness T5 of a flat bottom surface of the cup-shaped element mounting part 201A is thinner than thickness T6 of the original lead as shown in FIG. 4(b). Then thickness T6 of the original lead is, for example, about 100 μm and thickness T5 of the bottom surface of the element mounting part 201A is about 80 μm. And the element mounting part 201A is preferably formed into a cup-shape, so that the outer bottom surface of the element mounting part 201A and the rear surface of the element mounting part other than the element mounting part, are on the same plane as shown in FIG. 4(b). In this way, heat generated from the light-emitting element 1 can efficiently be radiated outward, because the outer bottom surface of the element mounting part 201A is exposed, after encapsulating by the transparent resin 4, as shown in FIG. 3(b). And heat radiation efficiency is further improved by using copper material for the first lead 201 and the second lead 202.

The inner side surface of the cup-shaped element mounting part 201A is used as a reflector to reflect light emitted in horizontal direction of the page from the light-emitting layer 102, and send upward as shown in FIG. 3(b). Therefore the groove is not provided on the inner side surface. And when the inner side surface is used as a reflector, light scattering can be reduced and light collecting efficiency can be improved, by making plane roughness of the inner side surface smaller compared with roughness of the inner bottom surface, in other words, by making a smoother plane or a curved surface. In this case, to enhance light collecting efficiency, angle θ between the inner bottom surface and the inner side surface is preferably made, for example, approximately 135 degree, as shown in FIG. 4(b).

In the case of encapsulating the outer bottom surface of the element mounting part 201A with the transparent resin 4 so as to expose as in the embodiment of the present invention, it is preferable to provide the first lead 201 and the second lead 202 with, for example, the protruding portions for prevention of dropping, which are bent toward the opening edge side of the element mounting part 201A, in other words toward a direction so as to bite into the transparent resin 4, as shown in FIGS. 3(b) and 4(c). In this way, dropping of the second lead 202A from the transparent resin 4 can be prevented, because the surface of the protruding portion 202A, continuing from the exposed surface of the second lead 202, remains inside the transparent resin 4, as shown in FIG. 4(c).

Figure 5A:
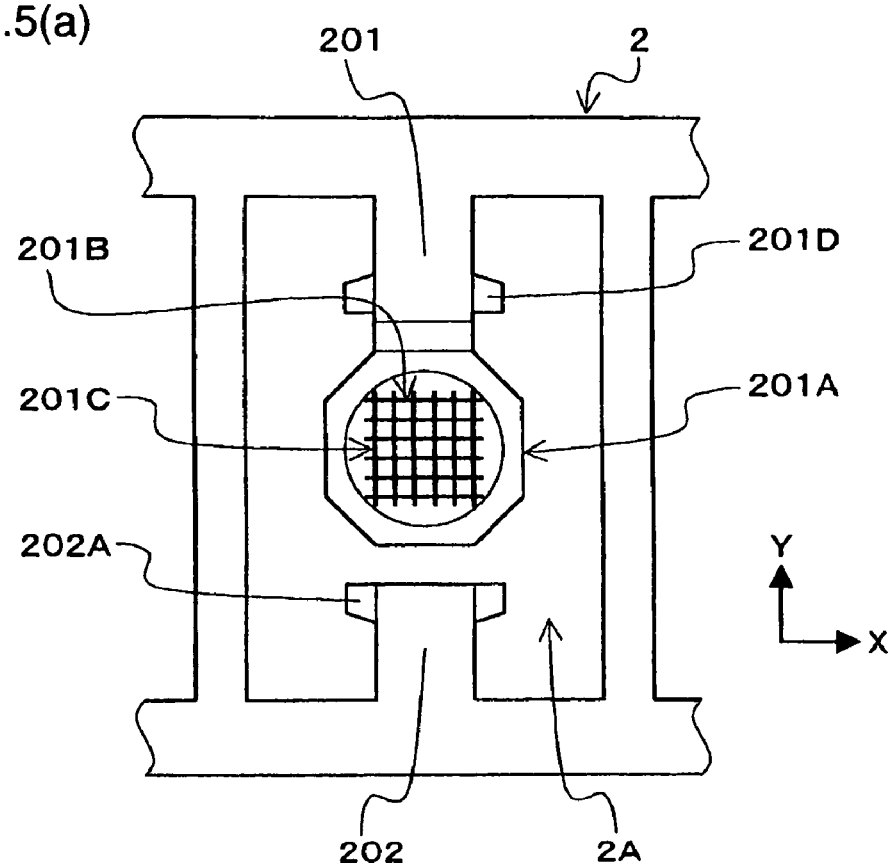
FIGS. 5(a) and 5(b) are schematic views explaining a method for producing a light-emitting device of the present embodiment.
Figure 5B:
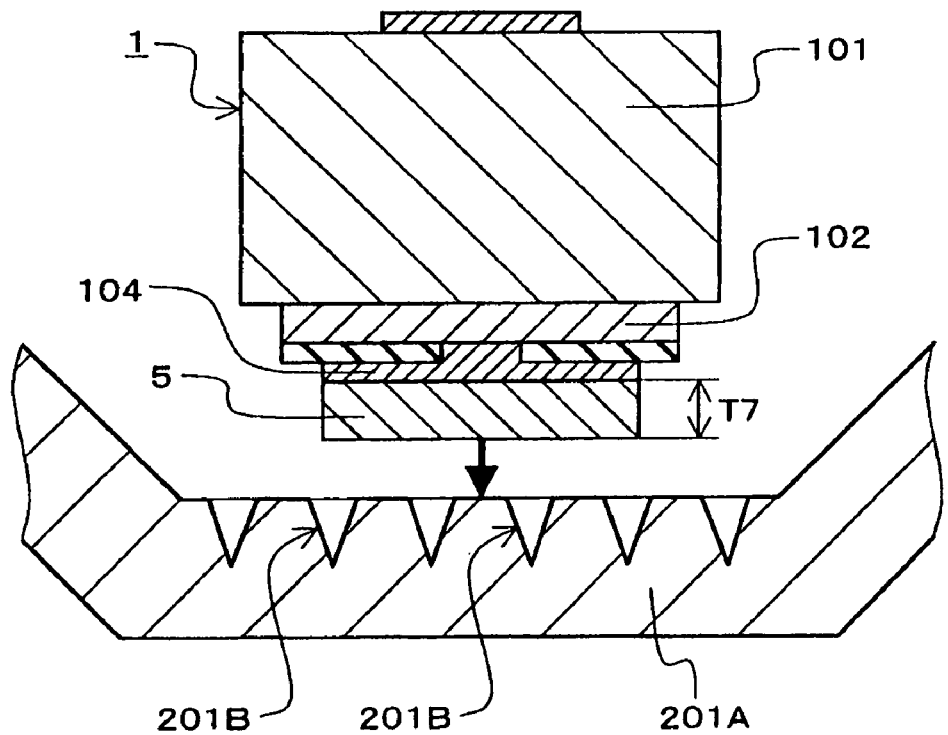
Figure 6A:
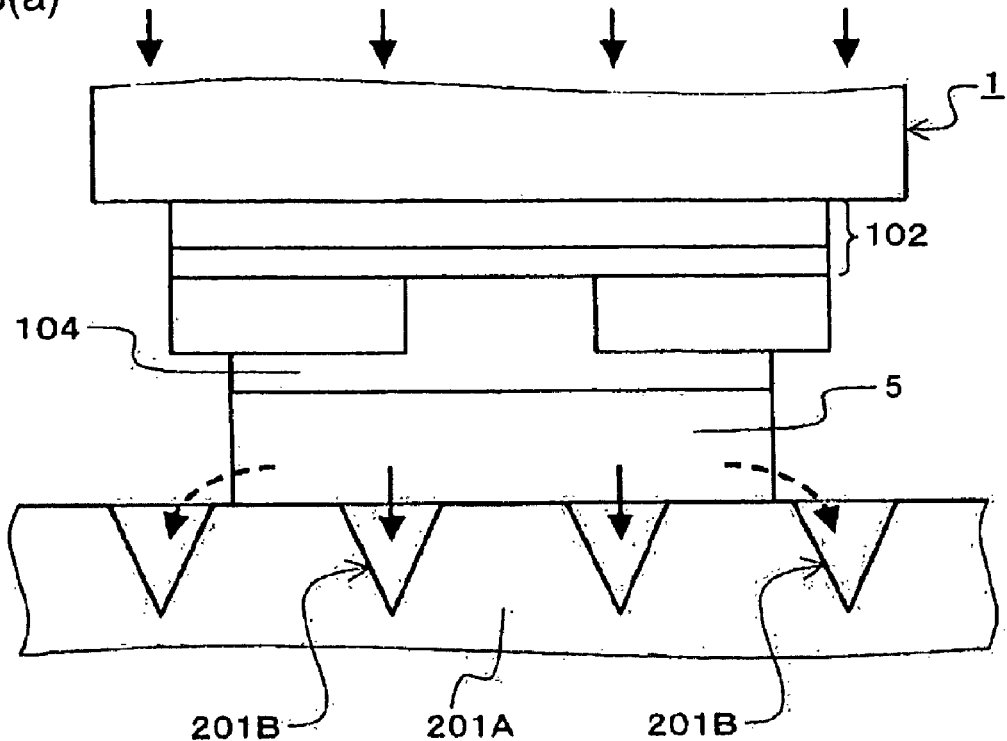
FIGS. 6(a) and 6(b) are schematic views explaining a method for producing a light-emitting device of the present embodiment and both of these figures explain effect of the present embodiment.
Figure 6B:
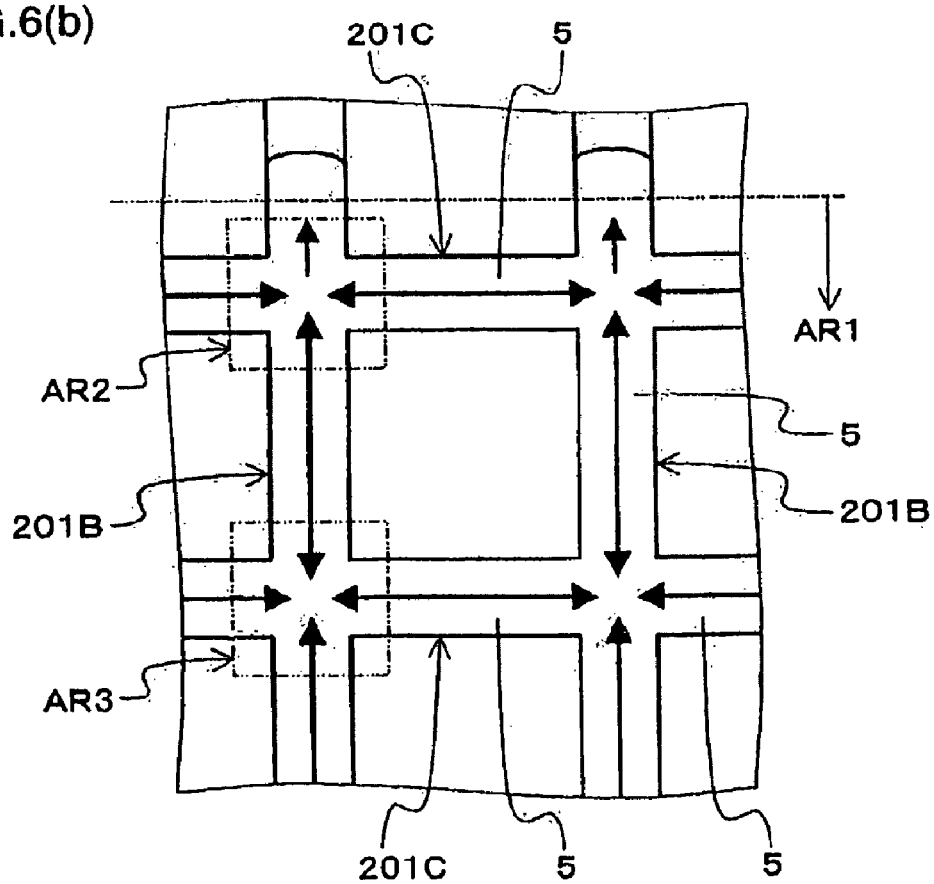
Figure 7:
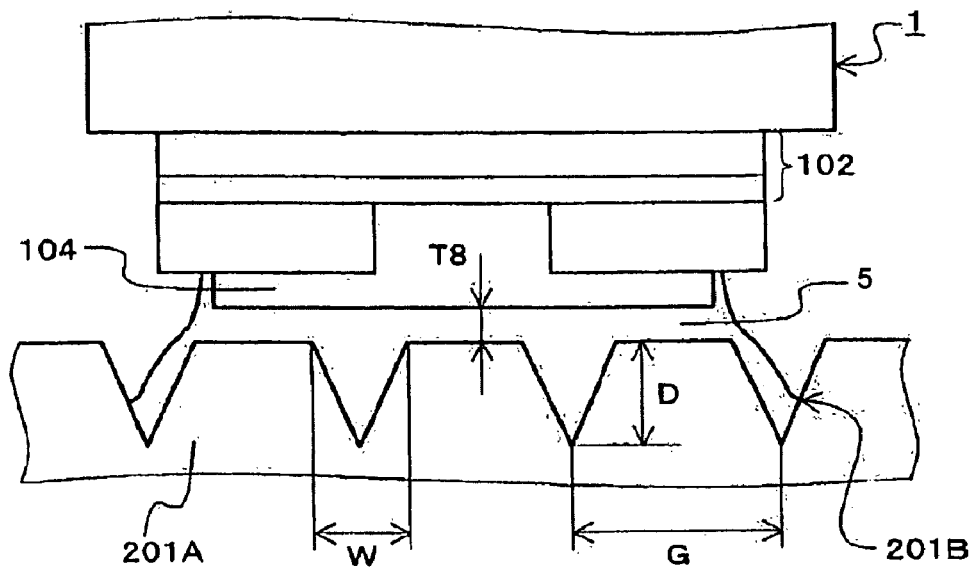
FIG. 7 is a schematic view explaining a method for producing a light-emitting device of the present embodiment, and also explaining a constitution of effective grooves.
Figure 8A:
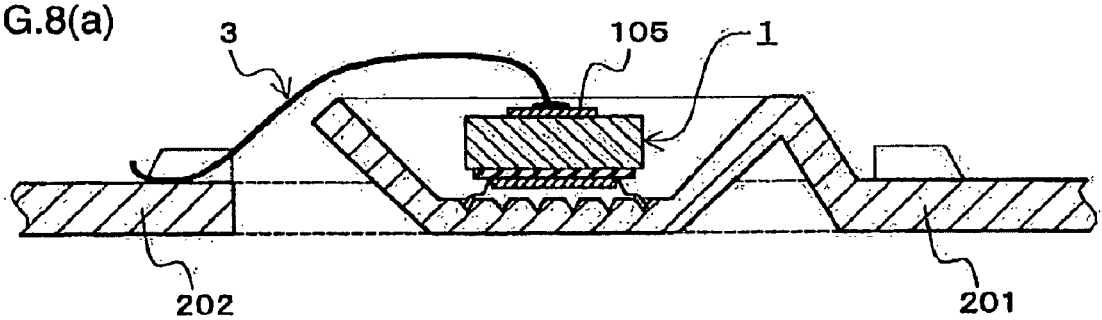
FIGS. 8(a) and 8(b) are schematic views explaining a method for producing a light-emitting device of the present embodiment.
Figure 8B:
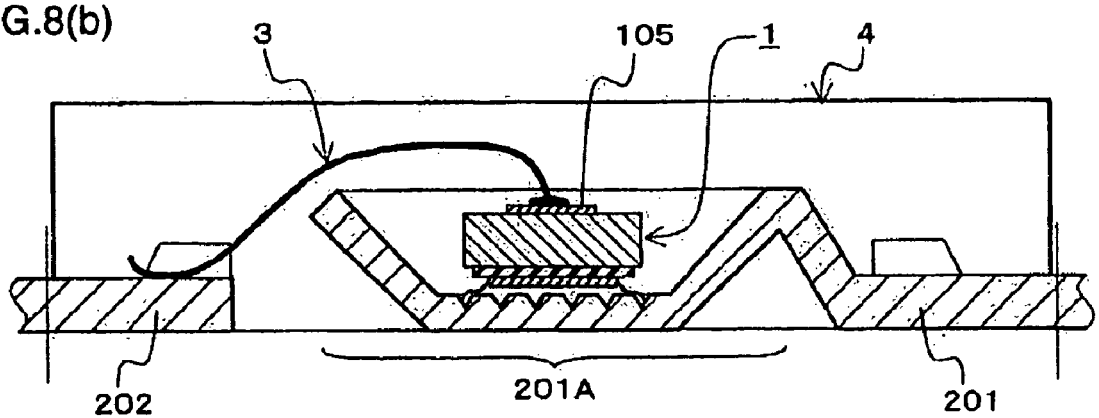

FIGS. 5(a), 5(b), 6(a), 6(b), 7, 8(a) and 8(b) are schematic views explaining a method for producing a light-emitting device of the present embodiment; FIG. 5(a) is a plan view of a constitution of a lead frame; FIG. 5(b) is a cross-sectional view of a step of electrically connecting the first electrode of a light-emitting element and the first lead; FIGS. 6(a) and 6(b) explain effect of the present embodiment; FIG. 7 explains a constitution of effective grooves; FIG. 8(a) is a cross-sectional view of a step of electrically connecting the second electrode of a light-emitting element and the second lead; and FIG. 8(b) shows a step of encapsulating with a transparent resin.

In the case of producing a light-emitting device of the present embodiment, for example, as shown in FIG. 5(a), the lead frame 2 is used, formed with the opening part 2A by opening a conductive plate, having the first lead 201 and the second lead 202 protruding to the opening. For this, for example, a copper plate with a thickness of approximately 100 μm, is used as the lead frame (conductive plate) 2. And the lead frame 2 may either be a long tape in one direction or a rectangle shape, and a plurality of opening parts 2A may be formed in series in an X direction as shown in FIG. 5(a), or only one opening part 2A may be formed on one conductive plate. While a method for producing the lead frame 2 is described later, in the explanation here, the element mounting part 201A of the first lead 201 is formed into a cup-shape, and grid-like grooves 201B and 201C are formed on the inner bottom surface. And the protruding portions 201D and 202A, in the first lead 201 and the second lead 202, for prevention of dropping are bent toward the opening edge side of the element mounting part 201A.

Production of a light-emitting device by using the above-described lead frame 2, starts from by electrically connecting the inner bottom surface of the element mounting part 201A of the first lead 201 and the first electrode 104 of the light-emitting element 1, so as to oppose each other. For this, the joining material film 5 made of, for example, a gold-tin alloy has been formed in advance on the first electrode 104 of the light-emitting element 1, as shown in FIG. 5(b). The gold-tin alloy film is formed, for example, by a vapor deposition method. And thickness T7 of the joining material film (gold-tin alloy film) 5 is set, for example, to be 1.5 μm. The joining material film 5 is not limited to the gold-tin alloy, but may be formed by using a joining material made of other alloys or a single metal. And the joining material film (gold-tin alloy film) 5 may be formed by using sputtering or plating, not limited to a vapor deposition method. Additionally a joining material film which has been formed into a thin film in advance may be attached on the first electrode 104. In the present embodiment, brazing filler material made of a metal with low melting point, and formed into a thin film in advance, is used as the joining material as described above. A silver paste which is conventional typical conductive adhesive, is a mixture of silver particles as conductive particles, and an organic resin paste as medium such as a epoxy resin. Such conductive adhesive which is a mixture of different kinds of materials, having paste-like characteristics at room temperature, has difficulty in advanced control of feed quantity or a shape after feeding. In the present embodiment, there is high risk of short circuit caused by joining material, because distance between the element mounting part 201A and the light-emitting layer 102 is small, since the light emitting-layer 102 of the light-emitting element 1 is located between the element substrate 101 and the element mounting part 201A. For such element structure, prevention of short circuit by using a bond such as a silver paste with poor controllability, is difficult. Therefore, in the present embodiment, for producing a light-emitting device with the light-emitting layer 102 being located between the element substrate 101 and the element mounting part 201A, short circuit risk of the light-emitting layer 102 caused by the joining material 5 could be reduced, by using the joining material 5 which has been formed into a thin film from a brazing filler material with high shape-controllability.

In a method for producing a light-emitting device of the present embodiment, as shown in FIG. 6(a), when the joining material film 5 is heated in contacting state with the element mounting part 201A of the first lead 201, the joining material film 5 melts or softens, and the first electrode 104 and the element mounting part 201A are joined. In this case, when the joining material film 5 is contacted with the element mounting part 201A under the condition that temperature of the element mounting part 201A has been raised to not lower than melting point of the joining material film 5 in advance, and that temperature of the light-emitting element 2 is kept at not higher than melting point of the joining material film 5, then a joining step can be finished in a short period of time. This enables to reduce degradation of characteristics of the light-emitting element 1 affected by heating during the joining step. And when the first lead 104 of the light-emitting element 1 and the first lead (element mounting part 201A) are joined by using the joining material film 5, the joining becomes poor when an oxide film is present on the surface. Therefore the joining step is preferably carried out under inert gas atmosphere not causing oxidation of each of the material, such as atmosphere of nitrogen gas or argon gas, and the like, or under a high vacuum.

When the joining material film 5 is a gold-tin alloy film, a gold-tin eutectic crystal is softened and joined at temperature not lower than eutectic temperature (280° C.), for example, not lower than 300° C. In the step, as load is applied from the second electrode 105 side, or minute vibration called scrub is added to the light-emitting element 1, as shown in FIG. 6(a), a portion of the softened gold-tin eutectic crystal flows into the grooves 201B and 201C of the element mounting part 201A, and spreads outside the joining area AR1 wherein the first electrode is placed. Therefore amount of the joining material 5 spreading outside the joining area AR1 can be reduced. Additionally, when the grooves 201B and 201C of the element mounting part 201A are extended to the outside of the joining area AR1, then air originally present in the grooves 201B and 201C, or gas generating by melting of the joining material 5, and entrained in the grooves 201B and 201C, can efficiently be exhausted, when the joining material 5 flows into the grooves 210B and 201C. Therefore generation of bubbles made of air or gas trapped by the joining material 5 flowing into the grooves 201B and 201C, can be prevented, which in turn can prevent lowering of joining strength, electric conductivity and thermal conductivity. It is also possible to prevent scattering of the joining material 5 occurring when air or gas present in the grooves 201B and 201C moves, or when gas or air trapped by the joining material flowing into the grooves 201B and 201C, is crushed, because the air or gas can efficiently be exhausted from the grooves 201B and 201C.

When load is applied on to the light-emitting element 1, in an initial stage, the joining material 5 flows into the grooves 201B and 201C, and exhausts gas or air present in the grooves 201B and 201C, however, once the grooves 201B and 201C are filled with the joining material 5, then the joining material flowing into the grooves 201B and 201C tends to flow outward by itself, outside the joining area AR1 through the grooves 201B and 201C as shown in FIG. 6(b). Then, if the joining material 5, flowing into the grooves 201B and 201C, moves easily, the joining material easily spreads outside the joining area AR1. Therefore, for example, when grid-like grooves 201B and 201C, having a plurality of cross-points in the joining area AR1 wherein the first electrode 104 is placed, are formed in advance, like the lead frame 2 used in the present embodiment, the joining material 5 which tends to move along the grooves 201B and 201C, collides mutually at the cross-points AR2 and AR3, and the like, and flow of the joining material is restricted. Therefore amount of the joining material 5 spreading outward outside the joining area AR1 enables to be minimized.

As a result, as shown in FIG. 7, control of thickness T8 of the joining material 5 in the joining area wherein the first lead 104 is placed, to secure the sufficient joining strength, becomes easy, and also amount of the joining material 5 spreading outward outside the joining area AR1 can be reduced. Therefore the joining material 5 spreading out outside the joining area AR1 can be prevented from climbing up along the side surface of the light-emitting element 1. In addition, as the climbing up of the joining material 5 can be prevented, short circuit due to climbing up of the joining material 5, or reduced amount of light (brightness) due to blocking of light emitted from the light-emitting layer 102, can be prevented.

In this case, thickness T8 of the thinnest part of the joining material 5 in the area wherein the first lead 104 is placed, after joining, is determined by factors such as material, temperature during joining, load during joining, affinity of the first electrode and the surface of the element mounting part to the joining material. As an example, thickness T8 of the thinnest part of the joining material 5 is 0.5 µm. In the present embodiment, as thickness T7 of the joining material film before joining is set to be 1.5 µm, about two-thirds of the total volume of the joining material film 5 formed on the first electrode 104, flows into the grooves 201B and 201C, or spreads outside the joining area AR1, as an excessively fed joining material, as a result. In this case, to minimize amount of the joining material 5 spreading outside the joining area, volume of the grooves 201B and 201C inside the joining area AR1 is preferably about the same as volume of the above-described excessively fed joining material.

Even if the above mentioned preferable condition concerning volume of the grooves 201B and 201C is satisfied, in the case when depth of the grooves 201B and 201C is small and width is large, the joining material 5 flowing into the grooves 201B and 201C, easily flows outward and spreads outside the joining area AR1, because flow resistance to the joining material 5 flowing into the grooves 201B and 201C, becomes small. If width of the grooves 201B and 201C is larger, there is a problem in that thermal conductivity lowers, or the light-emitting element inclines during joining, because area of upper convex portions divided by the grooves 201B and 201C becomes small.

Therefore, width W and distance G of the grooves 201B and 201C are preferably determined, so that area of the region forming the grooves 201B and 201C in the joining area is not larger than half the total joining area. In this case, to satisfy the preferable condition on volume of the grooves 201B and 201C, depth D of the grooves 201B and 201C is preferably at least larger than thickness T7 of the joining material 5 formed on the first electrode 104 of the light-emitting element 1. However, if depth D of the grooves 201B and 201C is too large, there is high generation risk of bubbles or cavities in the grooves 201B and 201C, because it is difficult to fill the grooves 201B and 201C with the molten or softened joining material 5. When thickness of the joining material 5 is 1.5 µm, as in the present embodiment, depth D of the grooves 201B and 201C is preferably set to about 3 to 13 µm, and most preferably 6 to 8 µm. And width of the grooves 201B and 201C is preferably about 5 to 30 µm, and distance G is preferably about 60 µm.

After the first electrode 104 of the light-emitting element 1 and the first lead 201 (element mounting part 201A) are joined as above, the second electrode 105 of the light-emitting element 1 and the second lead 201 are electrically connected with the bonding wire 3, as shown in FIG. 8(a), similarly as in a conventional production method. Then, as shown in FIG. 8(b), the light-emitting element 1, the joining part of the first electrode 104 of the light-emitting element and the element mounting part 201A, along with the connecting part of the second electrode 105 of the light-emitting element 1 and the second lead 201, are sealed with the transparent resin 4. In the step, if the transparent resin 4 is formed only on the surface side of the lead frame wherein the light-emitting element 1 is provided as shown in FIG. 8(b), encapsulating is possible so that the outer bottom surface of the element mounting part 201A is exposed to the surface of the transparent resin 4, which then improves heat radiation. And when wavelength conversion material, including a fluorescent pigment or a fluorescent dye, is filled in the cup-shaped element mounting part 201A, before encapsulating with the transparent resin 4, it is possible to arbitrarily convert wavelength of light emitted from the light-emitting element 1 and possible to emit any-colored light. Thereafter, by cutting out the first lead 201 and the second lead 202, from the lead frame 2, to produce a discrete device, the light-emitting device, as shown in FIG. 3(b), is obtained.

Figure 9A:
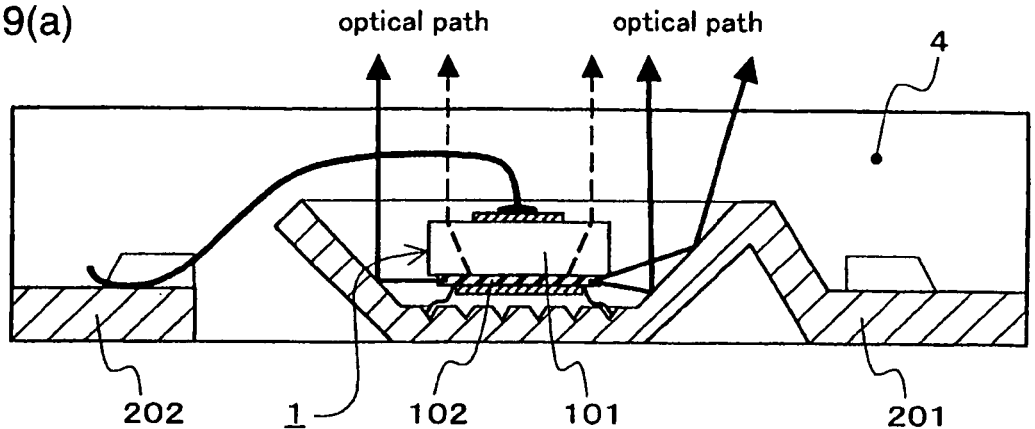
FIGS. 9(a), 9(b), and 9(c) are schematic views explaining features of a light-emitting device of the present embodiment.
Figure 9B:
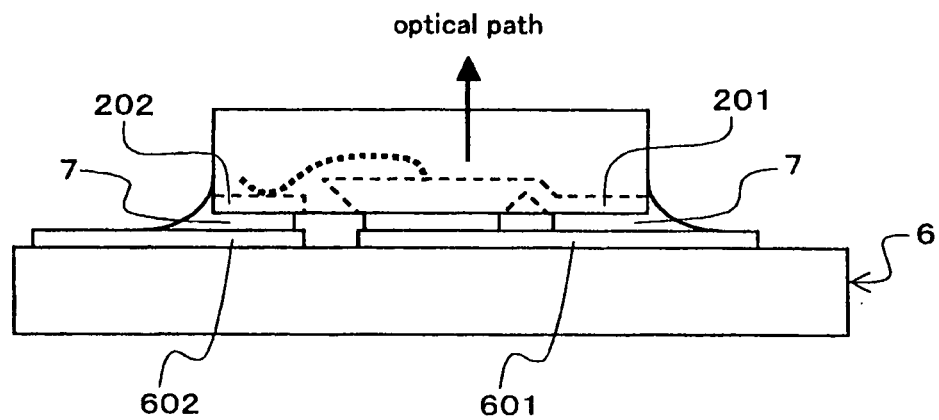
Figure 9C:
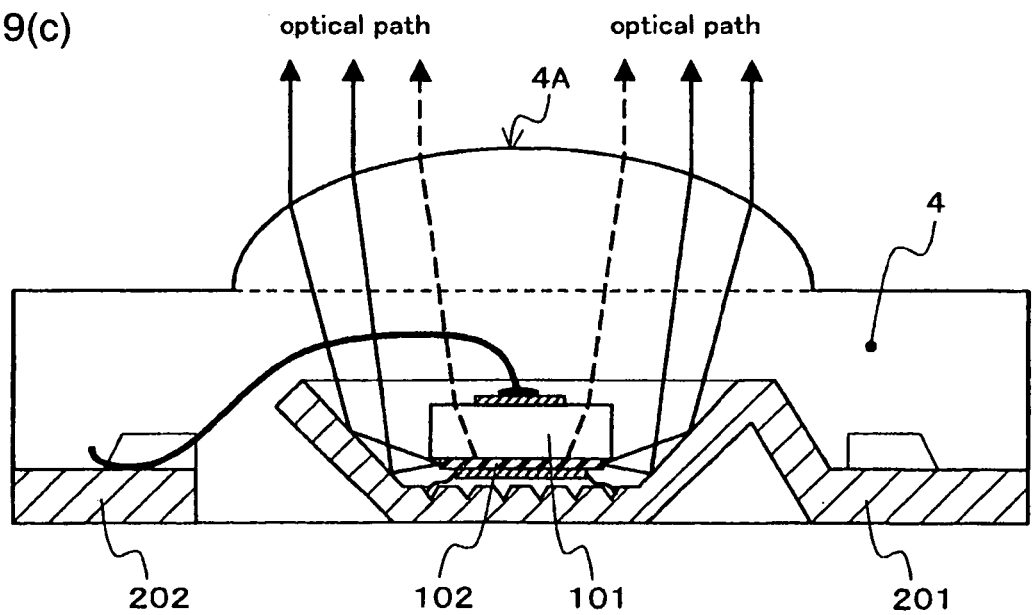

FIGS. 9(a), 9(b), and 9(c) are schematic views explaining features of a light-emitting device of the present embodiment; FIG. 9(a) explains action thereof; FIG. 9(b) explains a method for surface mounting on a printed circuit board; and FIG. 9(c) explains a deformation example of an outer shape of a transparent resin.

In a light-emitting device of the present embodiment, the light-emitting element 1 is provided inside the element mounting part 201A formed into a cup-shape, as shown in FIG. 9(a). And when the light-emitting element 1 is powered through the first lead 201 and the second lead 202, light is emitted from the light-emitting layer 102. In this case, light emitted from the side surface of the light-emitting layer 102 in a direction (horizontal direction of the page) parallel to the main surface of the element substrate 101, reflects on the inner side surface of the element mounting part 201A as shown in FIG. 9(a), alters path thereof upward, and is emitted from the light-emitting device. When the element substrate 101 is a transparent substrate, light emitted from the light-emitting layer 102 toward the element substrate 101, also transmits through the element substrate 101 and is emitted upward. As the first lead (element mounting part 201A) and the first electrode 104 of the light-emitting element 1 are joined with the joining material 5 made of metal such as a gold-tin alloy, it is possible to take ohmic contact, and therefore, high current can be passed. Therefore the light-emitting device can be used as a light-emitting device which requires highly bright light such as a flash lamp and a backlight for a liquid crystal display.

And in a light-emitting device of the present embodiment, the first lead 201 and the second lead 202 are exposed to the rear surface of the element mounting part 201A of the first lead 201, namely to the opposite side of the light emission surface. Therefore when the light-emitting device is surface mounted on a printed circuit board 6, the exposed surfaces of the first lead 201A and the second lead 202A are surface mounted as opposed to the printed circuit board 6, as shown in FIG. 9(b). In this case, the first lead 201 and the second lead 202 are electrically connected with wirings 601 and 602 of the printed circuit board, respectively, by using a solder joint material 7 such as a tin-lead alloy (SnPb) and a tin-silver alloy (SnAg). When the first lead 201 and the second lead 202 are electrically connected with wirings 601 and 602 of the printed circuit board using the solder joint material 7, the solder joint material 7 is heated and to be melted or softened. Therefore the joining material 5 connecting the first electrode 104 of the light-emitting element 1 and the element mounting part 201A, is preferably metal material having melting point higher than that of the joining material 7.

In a light-emitting device of the present embodiment, the convex lens portion 4A may be provided on the light emitting surface of the transparent resin, 4 as shown in FIG. 9(c). When the light emitting surface of the transparent resin 4 is flat as shown in FIG. 9(a), light emitting direction varies depending on the reflecting position, when light emitted from the light-emitting layer 102, reflects at the inner side surface of the element mounting part 201A, resulting in spreading of light emitted from the light emitting device. While the convex lens portion 4A is provided, as shown in FIG. 9(c), the light emitting direction is arranged by using the convex lens portion 4 and light collecting efficiency can be enhanced.

Next, a method for producing a lead frame used in producing a light-emitting device of the present embodiment will be explained.

Figure 10A:
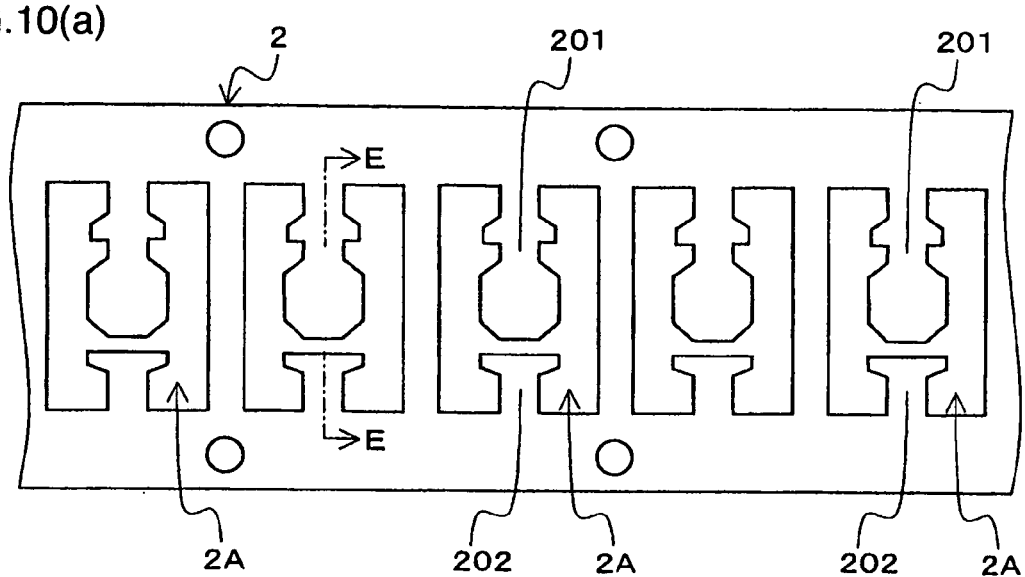
FIGS. 10(a), 10(b), and 10(c) are schematic views explaining a method for producing a lead frame used in producing a light-emitting device of the present embodiment.
Figure 10B:
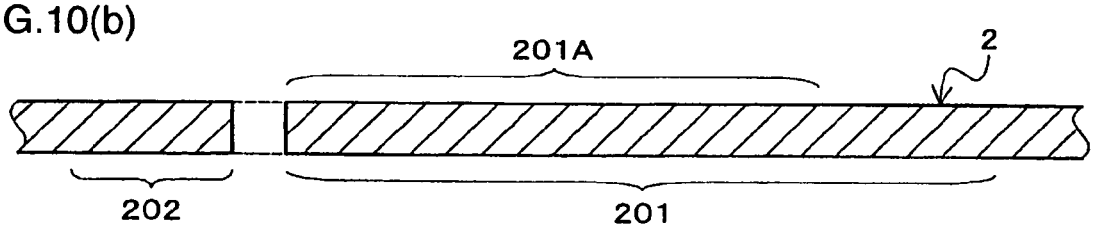
Figure 10C:
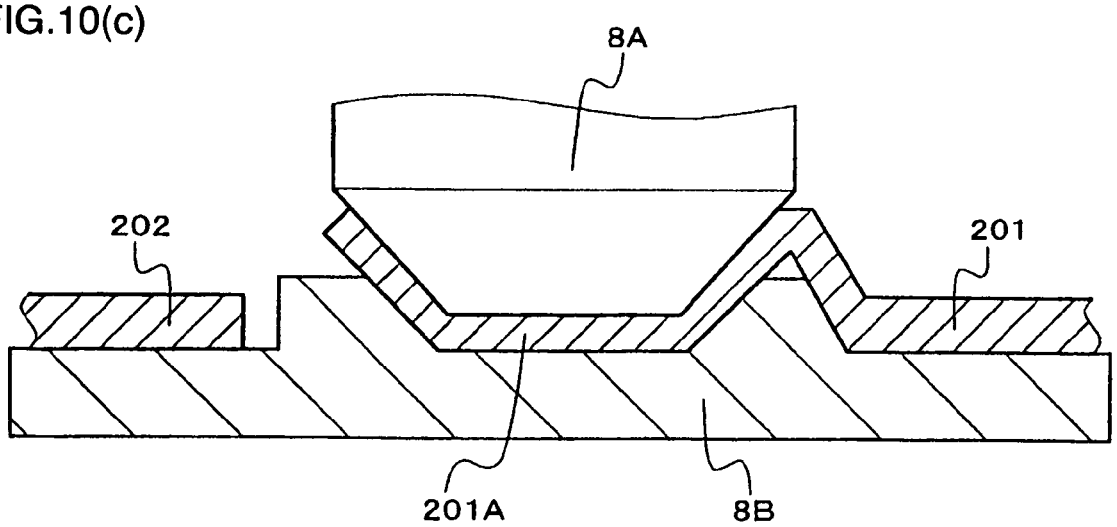
Figure 11A:
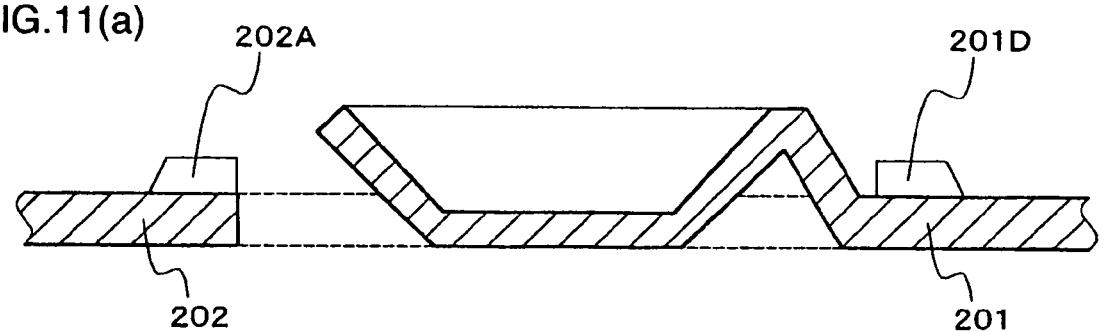
FIGS. 11(a), 11(b), and 11(c) are schematic views explaining a method for producing a lead frame used in producing a light-emitting device of the present embodiment.
Figure 11B:
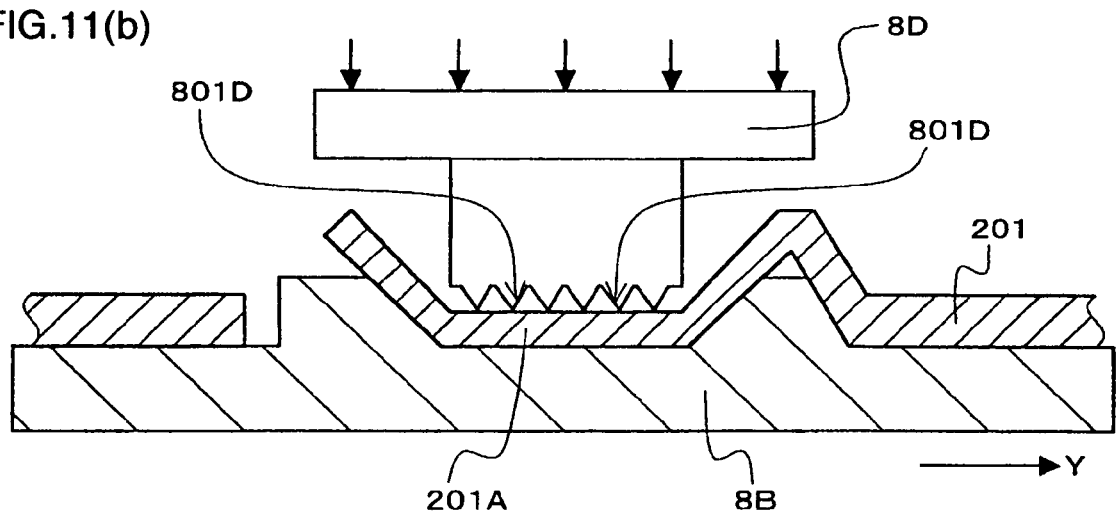
Figure 11C:
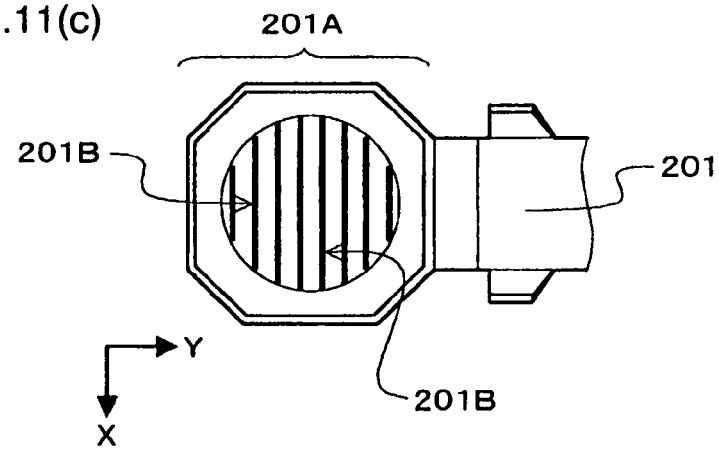

FIGS. 10(a), 10(b), 10(c), 11(a), 11(b) and 11(c) are schematic views explaining a method for producing a lead frame used in producing a light-emitting device of the present embodiment; FIG. 10(a) is a plan view of a step of opening a conductive plate; FIG. 10(b) is a cross-sectional view along E-E line in FIG. 10(a); FIG. 10(c) is a cross-sectional view of a step of forming an element mounting part into a cup-shape; FIG. 11(a) is a cross-sectional view of a step of bending a protruding portion; and FIGS. 11(b) and 11(c) are a cross-sectional view and a plan view, respectively, of a step of forming grooves on the inner-bottom surface of an element mounting part.

The lead frame 2, used in producing a light-emitting device of the present embodiment, is produced, for example, using either a long-tape in one direction or a rectangular-shaped conductive plate (copper plate). The opening parts 2A, with the first lead 201 and the second lead 202 protruding, are formed in series, as shown in FIG. 10(a). The opening parts 2A are formed by punching or etching. At this stage, as the first lead 201 and the second lead 202 are flat as shown in FIG. 10(b), and, for example, when a cut surface has burrs caused by punching, planarization treatment is required.

Next, the element mounting part 201A is formed into a cup-shape by pressing using a pair of metal molds 8A and 8B, as shown in FIG. 10(c). Subsequently, the protruding portions 201D and 202A for dropping prevention of the first lead 201 and the second lead 202, are formed by bending as shown in FIG. 11(a).

Next, an upper mold 8D, with angular profiled cutting teeth 801D arranged in a Y direction is pressed on to the inner bottom surface of the element mounting part 201A under the condition that the cup-shaped element mounting part 201A is supported by a lower mold 8, as shown in FIG. 11(b). Then the plurality of grooves 201B parallel to an X direction can be formed on the inner bottom surface of the element mounting part 201A, as shown in FIG. 11(c). Then the upper mold with angularly profiled cutting teeth 801D arranged in the X direction is pressed on to the inner bottom surface of the element mounting part 201A, to form a plurality of grooves 201C parallel to the Y direction, though a figure is omitted. As a result, the grid-like grooves 201B and 201C can be formed as shown in FIG. 4(a). In addition, the grooves 201B and 201C are not exclusively formed by the above-mentioned method, and for this purpose, grid-like cutting teeth may be provided on the surface contacting with the inner bottom surface of the element mounting part 201A, of a mold (upper mold 8A) used for forming an element mounting part 201A into a cup-shape. In this way, because the grid-like grooves 201B and 201C are simultaneously formed on the inner surface of the element mounting part 201A when the element mounting part 201A is formed into a cup-shape, forming of grooves by using the mold 8D as shown in FIG. 11(*b*) is not required.

As explained above, according to a method for producing a light-emitting device of the present embodiment, by connecting the first lead 201 (element mounting part 201A) of the lead frame with the joining material 5 provided on the first electrode 104 of the light-emitting element 1, amount of the joining material 5 flowing outside the joining area AR1 wherein the first electrode 104 is placed, can be reduced and climbing up of the joining material along the side surface of the light-emitting element 1 can be prevented. Therefore short circuit and light blocking can be prevented, which are caused by joining the side of the light-emitting layer 102 with thickness of several micrometers, and the element mounting part 201A, so as to oppose each other. And as defective products due to the short circuit and the blocking of light are decreased, a production yield of the light-emitting device can be improved.

Because the first electrode 104 of the light-emitting element 1 and the first lead 201 (element mounting part 201A) are joined with the joining material 5 made of an alloy or a single metal, ohmic contact can be taken and high current can be passed. Therefore enhanced brightness of the light-emitting device can easily be realized.

Additionally, because the first electrode 104 of the light-emitting element 1 and the first lead 201 (element mounting part 201A) are joined with the joining material 5 made of an alloy or a single metal, heat conduction from the light-emitting element 1 to the first lead 201 is improved. If the first lead 201 consists of copper material, heat radiation efficiency will further be enhanced.

When the first lead 201 (element mounting part 201A) made of copper material is provided with, for example, the light-emitting element 1 having an element substrate made of a compound semiconductor such as GaAs, fracture may sometimes occur due to thermal stress during joining, however, as explained in the present embodiment, if the grooves 201B and 201C are formed on the element mounting part 201A, the thermal stress can be dispersed and fracture of the element substrate 101 due to the thermal stress can be prevented.

As explained in the present embodiment, when the element mounting part 201A of the first lead 201 is formed into a cup-shape, light emitted from the light-emitting element 1 can be emitted with high light collecting efficiency, even if a reflector is not provided separately.

In the present embodiment, the grooves 201B and 201C on the element mounting part 201A of the first lead 201 are the grid-like groove 201C made of a plurality of grooves 201B parallel to the X direction, and a plurality of grooves 201C parallel to the Y direction, however, other patterns are acceptable as long as the patterns satisfy the above-described preferable conditions including volume of the grooves and cross-points.

Figure 12A:
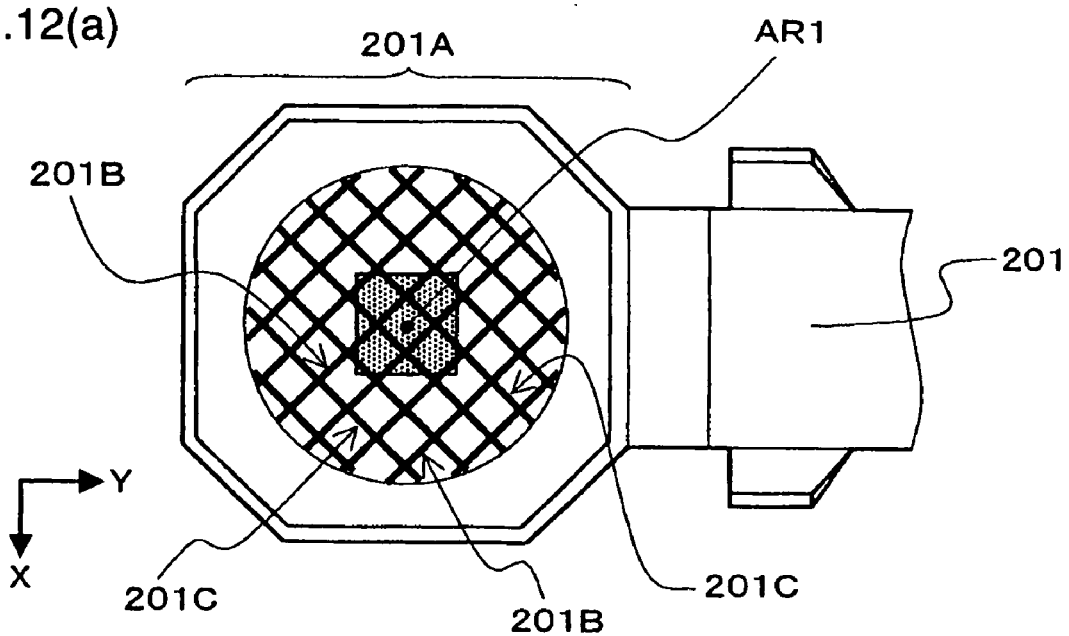
FIGS. 12(a) and 12(b) are schematic views explaining deformation examples of a lead frame used for producing a light-emitting device of the present embodiment, and both also explain deformation examples of a grid-pattern.
Figure 12B:
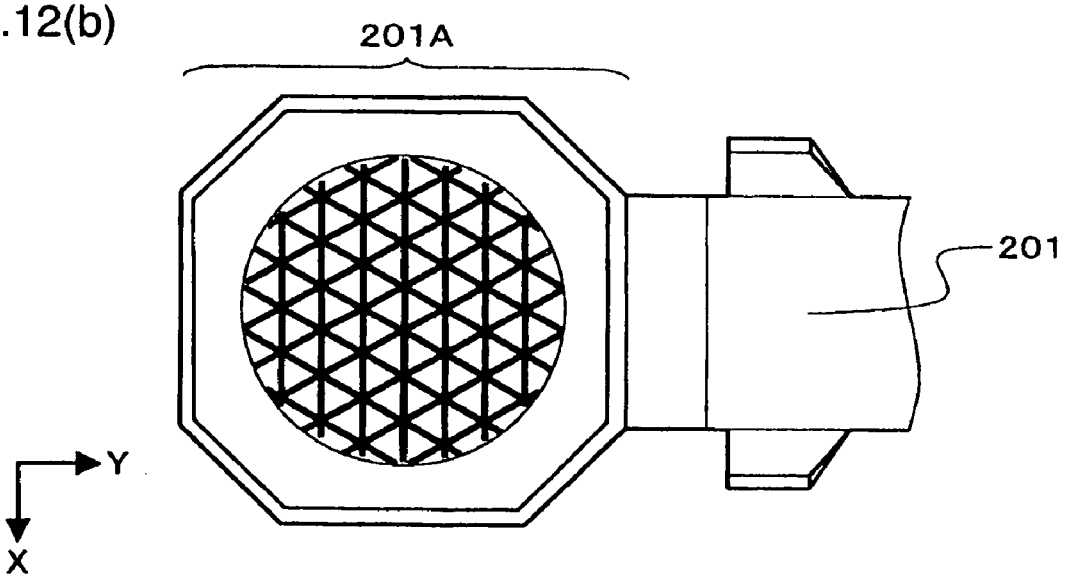
Figure 12B:
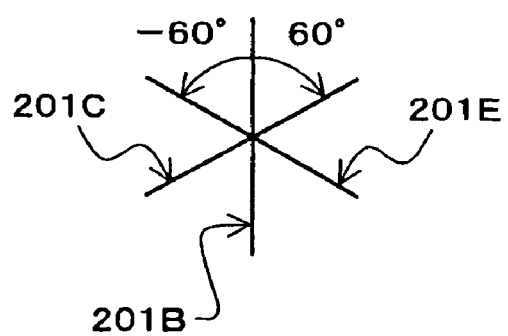

FIGS. 12(*a*), 12(*b*), 13, 14(*a*) and 14(*b*) are schematic views explaining deformation examples of a lead frame used in producing a light-emitting device of the present embodiment; FIGS. 12(*a*), 12(*b*) and 13 explain deformation examples of a grid-pattern; and FIGS. 14(*a*) and 14(*b*) show deformation examples of patterns other than the grid-pattern.

Figure 13:
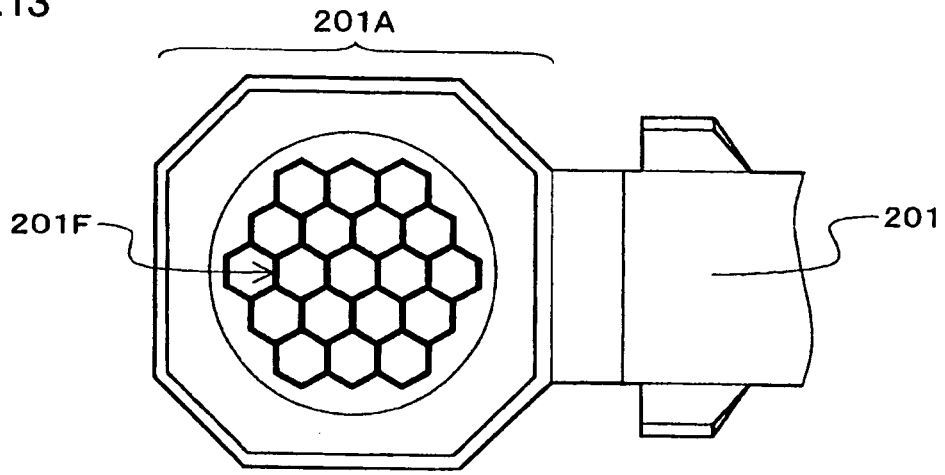
FIG. 13 is a schematic view explaining a deformation example of a lead frame used in producing a light-emitting device of the present embodiment, and also explains a deformation example of a grid-pattern.

In the lead frame 2 used in producing a light-emitting device of the present embodiment, when grooves are formed in the element mounting part 201A, it is preferable first of all, concerning volume of grooves as described above, that volume of grooves in the joining area AR1 wherein a first electrode 104 of the light-emitting element 1 is placed, be approximately equal to volume that comes from total volume of the joining material 5 formed on the first electrode 104, minus volume equivalent to the product of area of the joining area AR1 and thickness T8, after joined. And to reduce amount of the joining material 5 spreading outside the joining area AR2, after flowing into the grooves, a plurality of cross-points preferably be present in the joining area AR2. In addition, to efficiently exhaust gas or air present in the grooves, when the joining material 5 flows into the grooves, all the grooves formed preferably be connected directly or through other crossing grooves, with grooves outside the joining area AR2. When such preferable conditions are satisfied, groove pattern formed on the element mounting part 201A, may take a grid-pattern made of a plurality of parallel grooves 201B having an angle of 45 degrees to the X direction, and a plurality of parallel grooves 201C having an angle of −45 degrees to the X direction, as shown in FIG. 12(*a*). As another example, grooves with a grid-pattern which includes a plurality of grooves 201B parallel to the X direction, a plurality of parallel grooves 201C having an angle of 60 degrees to the X direction, and a plurality of parallel grooves 201C having an angle of −60 degrees to the X direction, and divide the surface of the element mounting part 201A by triangle, as shown in FIG. 12(*a*), are also acceptable. Furthermore, not limited to a grid-pattern in combination of parallel and a plurality of grooves as described above, the groove 201F with a grid-pattern which divides the bottom surface of the element mounting part 201A by hexagon, as shown in FIG. 13 is also acceptable.

Figure 14A:
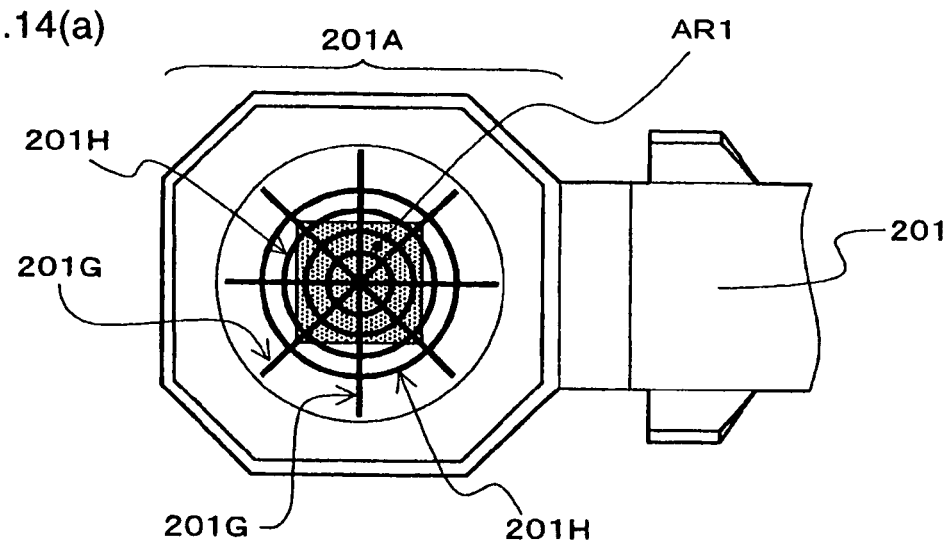
FIGS. 14(a) and 14(b) are schematic views explaining deformation examples of a lead frame used in producing a light-emitting device of the present embodiment, and both also explain deformation examples of patterns other than a grid-pattern.
Figure 14B:
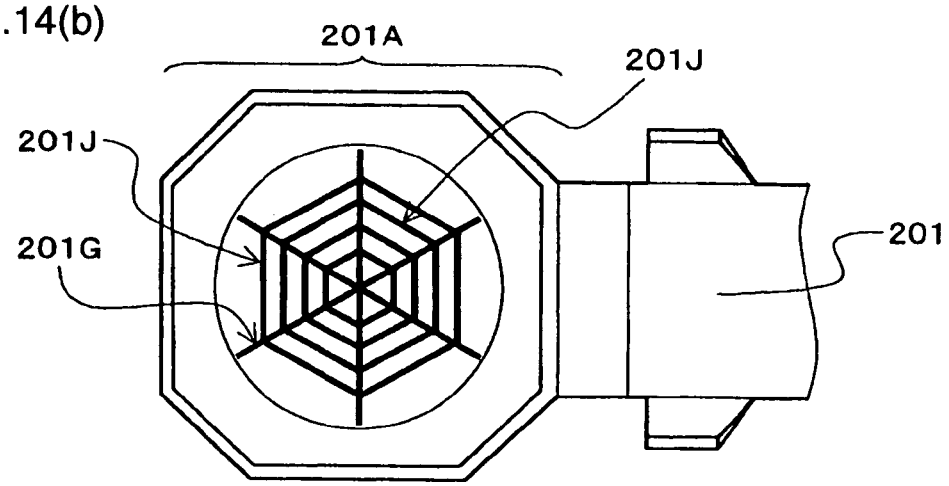

When grooves, formed on the inner bottom surface of the element mounting part 201A, satisfy the conditions concerning volume of grooves and cross-points, grooves which are different from the grooves dividing the bottom surface of the element mounting part 201A into a repeating shape pattern, namely a grid-pattern as described above, are acceptable. An example of such grooves to be considered is grooves with a pattern in combination of grooves 201G extending radially from a center of the joining area AR2, and a plurality of annular grooves 201H having different radius around a centre of the joining area AR2. In such a pattern, the joining material 5 flowing into the annular grooves 201H, collides at cross-points with radially extending grooves 201G, and the joining material flow to the outside of the joining area AR2 can be restricted. The annular grooves are not limited to circular grooves as shown in FIG. 14(*a*) and, for example, polygonal (hexagonal) grooves 201J as shown in FIG. 14(*b*) are also acceptable.

The above explanations are for the cases for forming the grooves satisfying the preferable conditions concerning volume of grooves and a pattern on the inner bottom surface of the element mounting part 201A, however, if the preferable conditions are satisfied, a pattern provided with a plurality of insular convex portions in a concave portion having a circumference outside the joining area AR2, is acceptable, not limited to grooves.

Figure 15A:
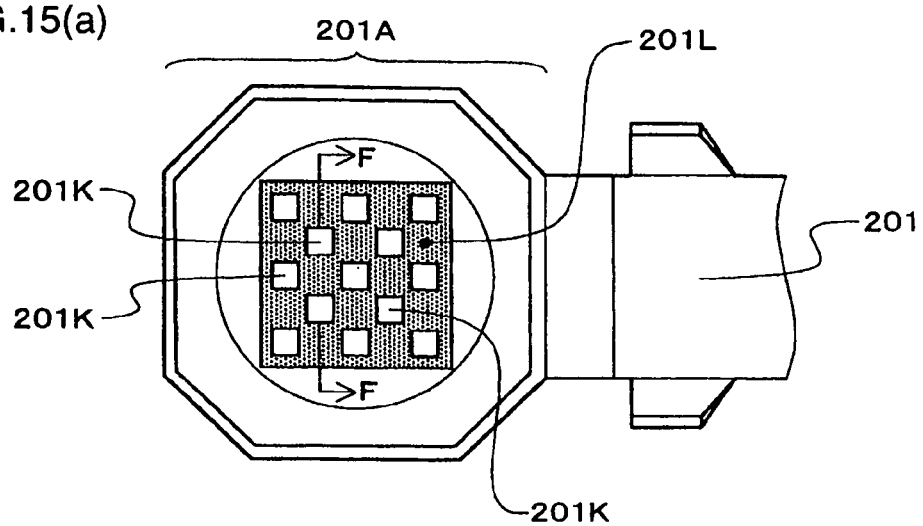
FIGS. 15(a) and 15(b) are schematic views explaining other deformation examples of a lead frame used in producing a light-emitting device of the present embodiment.
Figure 16A:
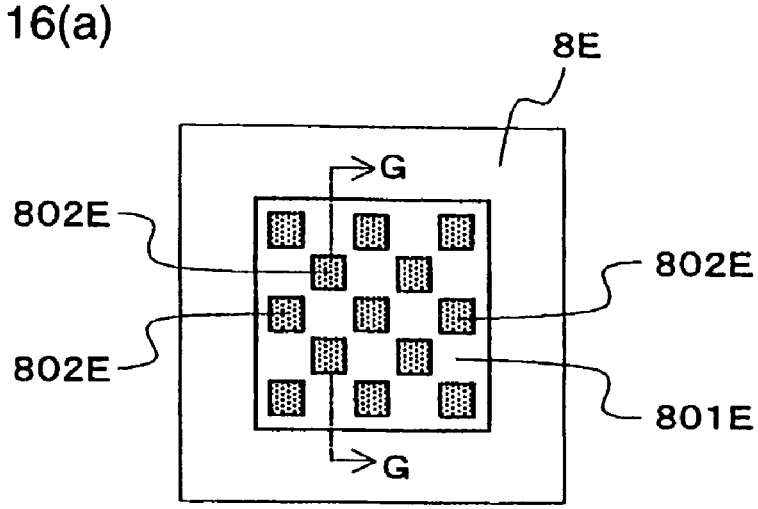
FIGS. 16(a) and 16(b) are schematic views explaining other deformation examples of a lead frame used in producing a light-emitting device of the present embodiment, and both explain a method for forming a concave portion.
Figure 16B:
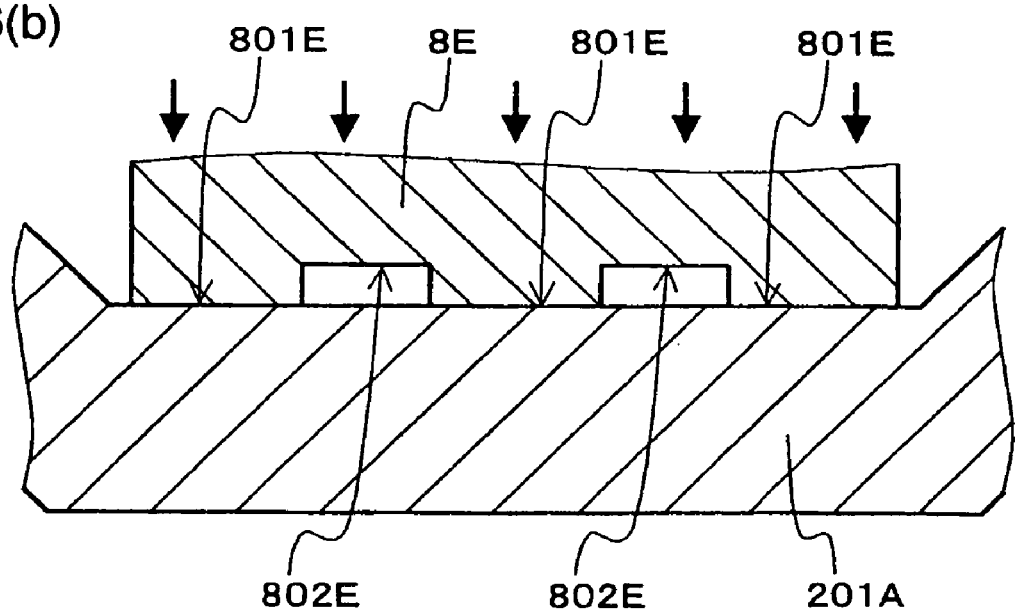
Figure 17A:
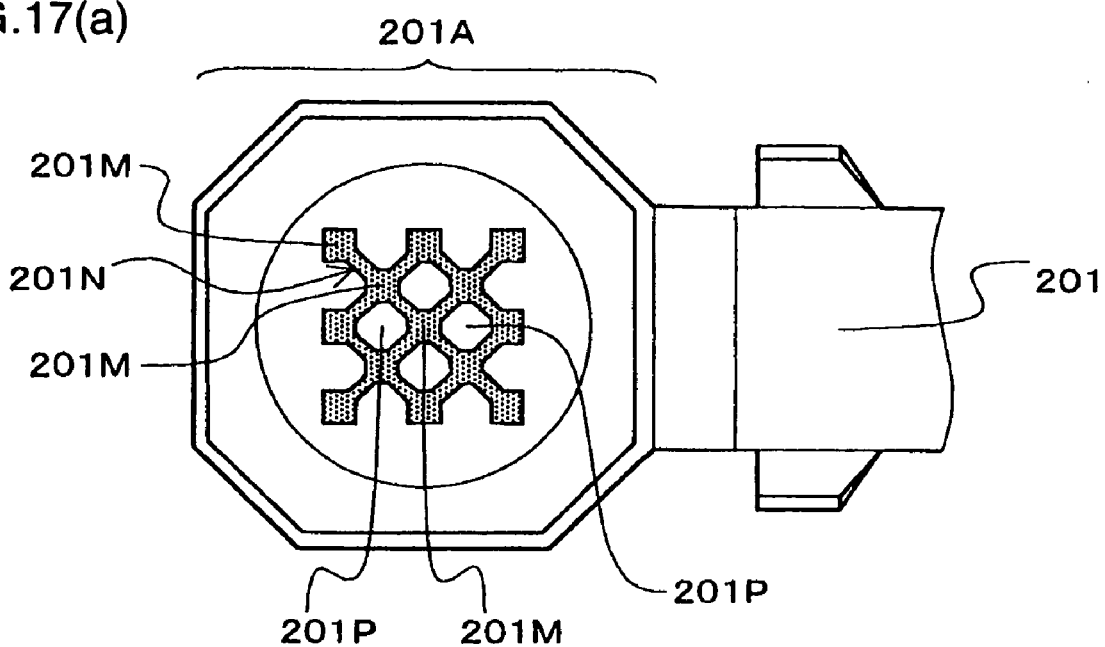
FIGS. 17(a) and 17(b) are schematic views explaining other deformation examples of a lead frame used in producing a light-emitting device of the present embodiment, and both explain deformation examples of a concave portion.
Figure 17B:
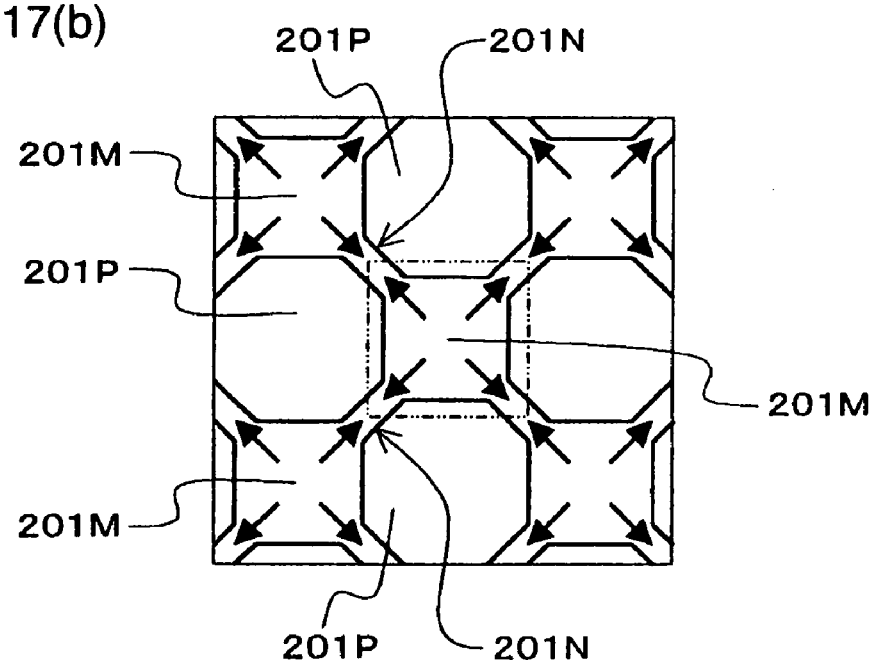

FIGS. 15(*a*), 15(*b*), 16(*a*), 16(*b*), 17(*a*) and FIG. 17(*b*) are schematic views explaining other deformation examples of a lead frame used in producing a light-emitting device of the present embodiment; FIG. 15(*a*) is a plan view showing a constitution of a concave portion provided with insular convex portions; FIG. 15(*b*) is a cross-sectional view along F-F line in FIG. 15(a); FIGS. 16(a) and 16(b) explain a method for forming a concave portion; and FIGS. 17(a) and 17(b) explain deformation examples of a concave portion.

Figure 15B:
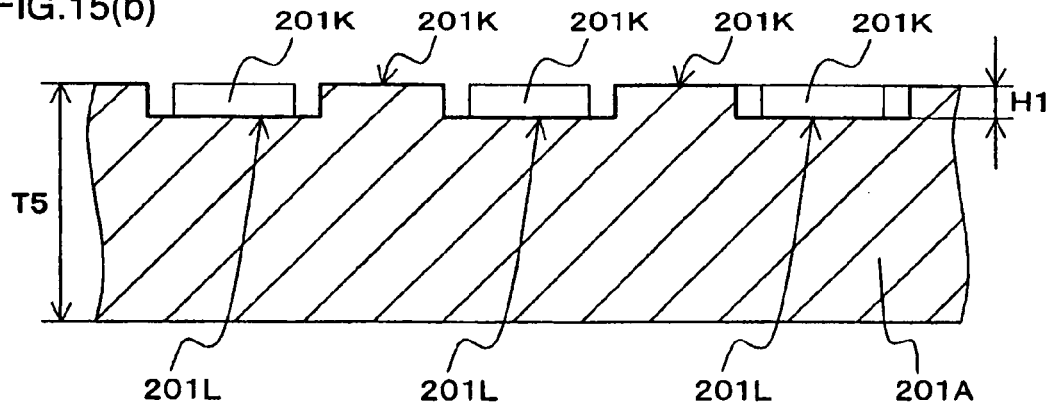

When the concave portion, having a plurality of insular convex portions, is formed in the inner bottom surface of the element mounting part 201A, instead of the grooves, for example, the concave portion 201L, which has convex portions 201K with quadrangular upper surfaces and is arranged in hound's tooth pattern, is formed as shown in FIGS. 15(a) and 15(b). Concerning a condition corresponding to a preferable condition about volume of the grooves, for example, volume of the concave portion in the joining area AR2, preferably be approximately equal to volume that comes from total volume of the joining material 5 formed on the first electrode 104, minus volume equivalent to the product of area of the joining area AR2 and thickness T8, after joined. To satisfy such a condition, height H1 of the convex portion 201K provided in the concave portion 201L, preferably be approximately 6 μm. A convex portion with such degree of height, in other words a concave portion 201L with a depth of about 6 μm, can be formed by press printing with a metal mold.

When press printing is implemented, a mold 8E (upper mold) provided with concave portions 802E where convex protrusion parts 201K are formed, in the surface 801E contacting with the inner bottom surface of the element mounting part 201A, is pressed and pressurized against the inner bottom surface of the element mounting part 201A, and the inner bottom surface may be subjected to plastic deformation. This press printing may be implemented either simultaneously with or after a step of forming the element mounting part 201A into a cup-shape.

When the concave portion 201L of the element mounting part 201A is formed, not limited to the pattern provided with the plurality of protrusion parts 201K in the concave portion 201L having a square or a rectangular bottom surface, as shown in FIG. 15(a), for example, such a concave portion may be used that is provided with the plurality of square concave portion 201M arranged on grid-point-likely connecting each other with the vent grooves 201N having narrow width, as shown in FIG. 17(a). In this case, area surrounded by the square concave portion 201M and the vent grooves 201N becomes the insular, protruded convex parts 201P. In the case of such a concave portion, joining material flowing into the concave portion 201M in the area AR4 shown in FIG. 17(b) can not flow out into another dent 201M without passing through the narrow vent grooves 201N. And when the joining material 5 flows into the concave portion 201M in the area AR4 and surrounding concave portion 201M connected by the vent grooves 201N, then the joining material 5 in the concave portion 201M of the area AR4 hardly flows outward into the surrounding concave portions 201M. Therefore the above-described preferable condition can be satisfied.

Thus far the explanation has been given by taking a light-emitting device shown in FIGS. 3(a) and 3(b) as an example. However, not limited to the light-emitting device with such a constitution, a method for producing of the present embodiment can be applied in producing various kinds of light-emitting devices.

Figure 18A:
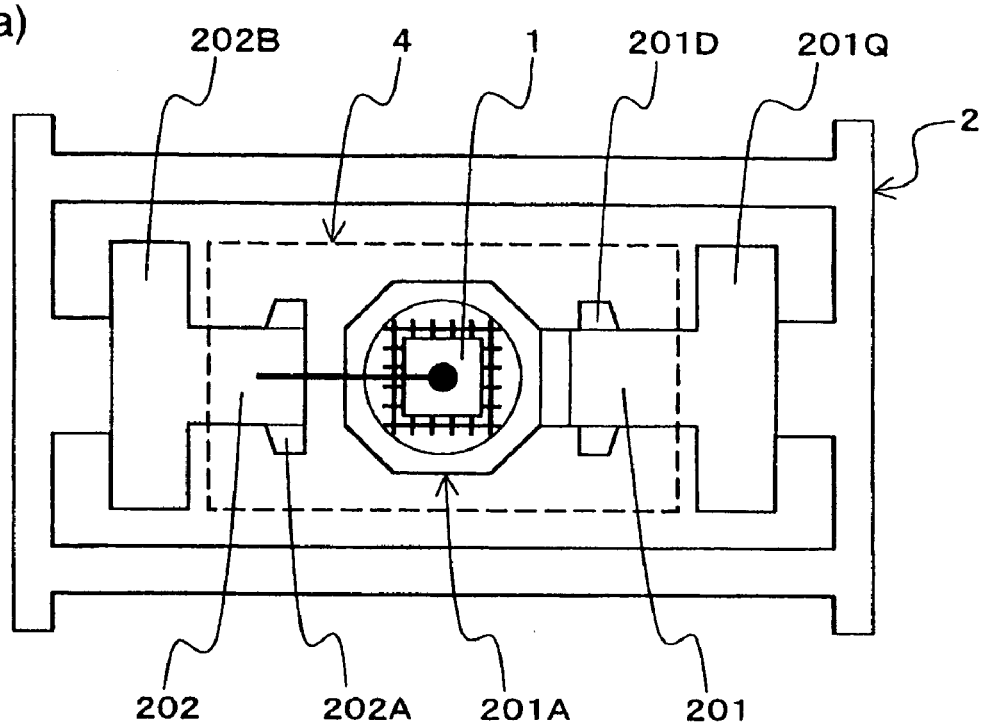
FIGS. 18(a), 18(b), and 18(c) are schematic views explaining application examples of a method for producing a light-emitting device of the present embodiment, and each showing an example of the case wherein a side surface of a transparent resin is provided with a lead.
Figure 18B:
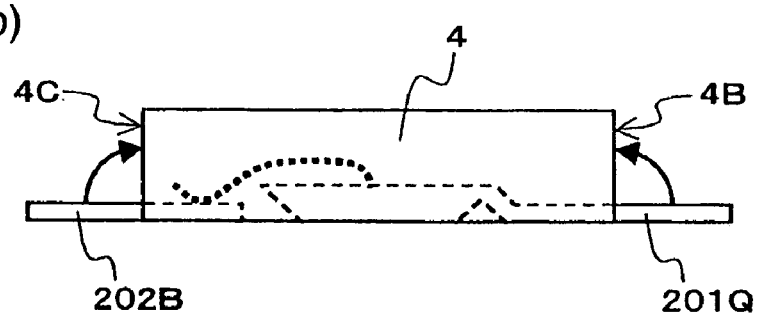
Figure 18C:
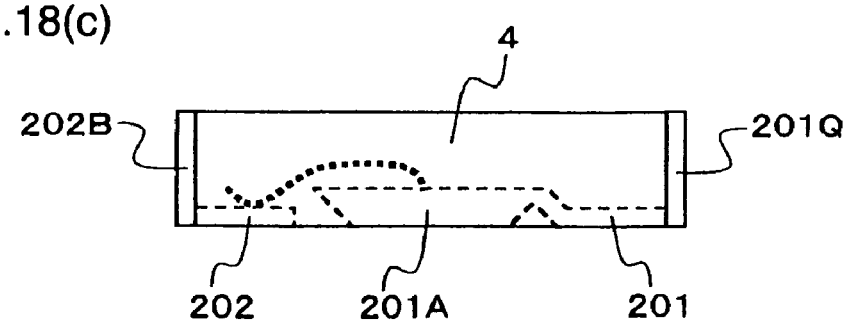
Figure 19A:
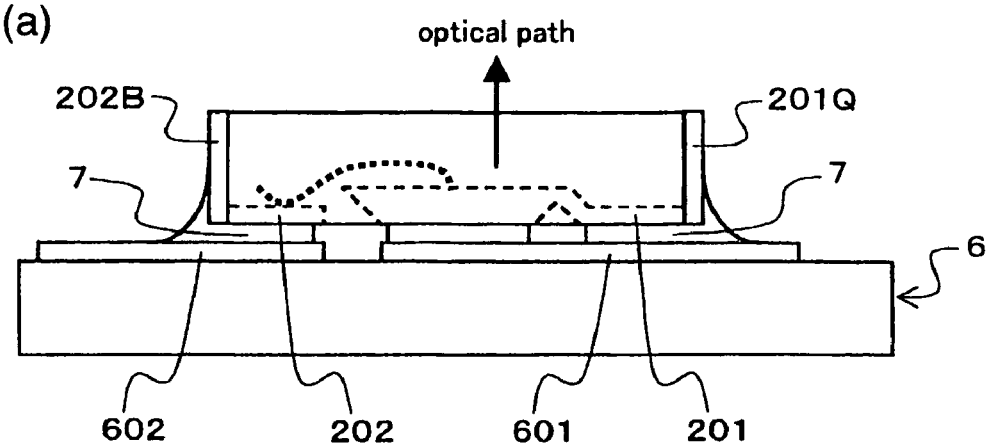
FIGS. 19(a), 19(b), and 19(c) are schematic views explaining application examples of a method for producing a light-emitting device of the present embodiment, and each showing examples of surface mounting a light-emitting device shown in FIG. 18(c).
Figure 19B:
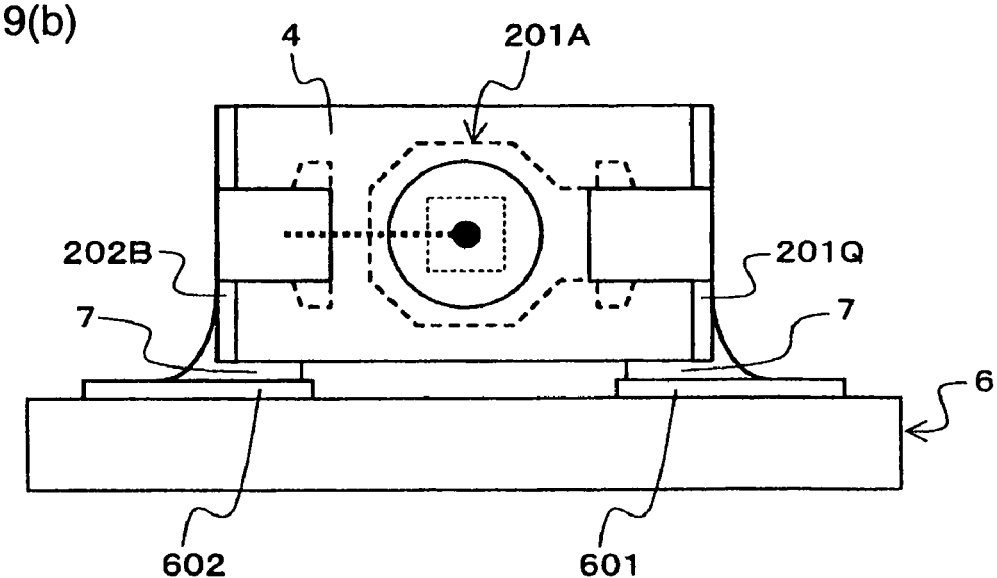
Figure 19C:
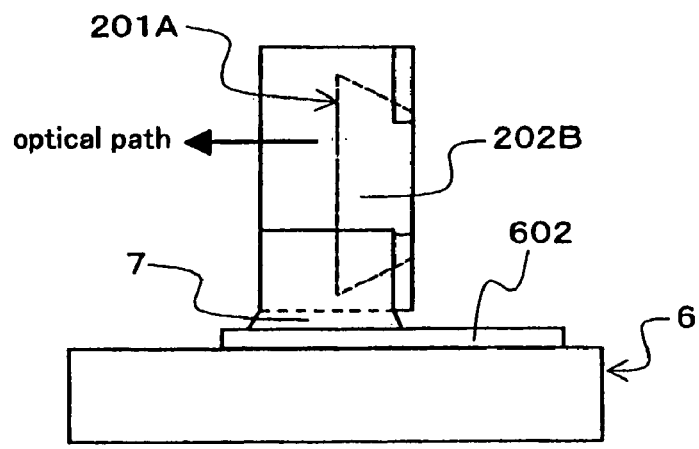
Figure 20:
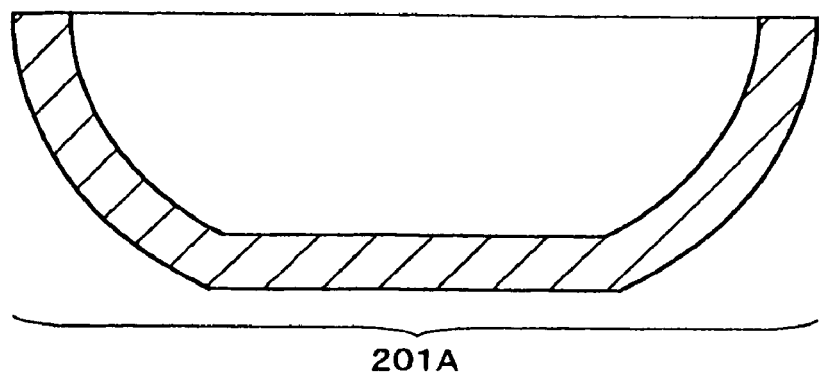
FIG. 20 is a schematic view explaining an application example of a method of producing a light-emitting device of the present embodiment, and showing an application of a shape of an element mounting part.
Figure 21A:
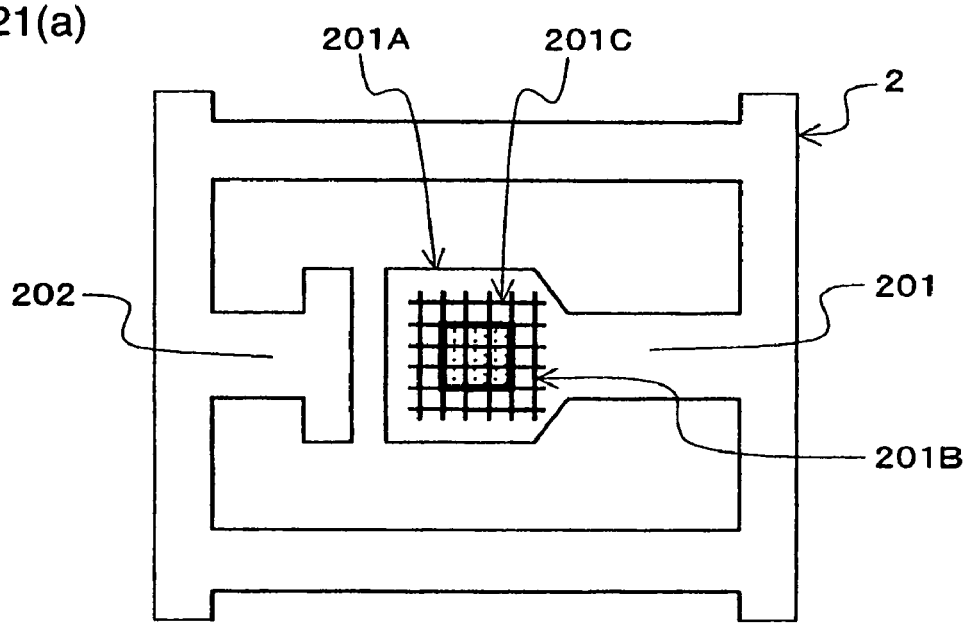
FIGS. 21(a) and 21(b) are schematic views explaining application examples of a method for producing a light-emitting device of the present embodiment, and showing examples of element mounting parts being flat.
Figure 21B:
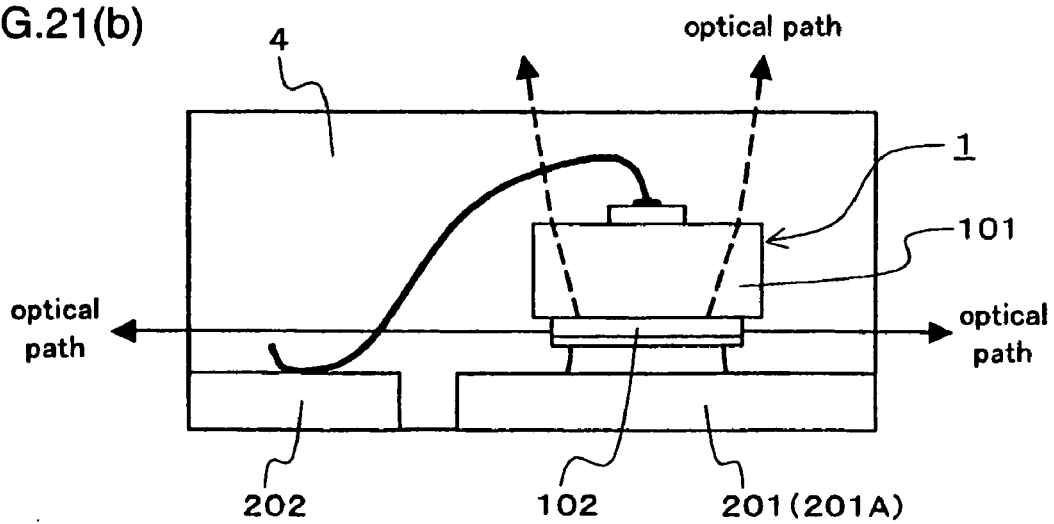

FIGS. 18(a), 18(b), 18(c), 19(a), 19(b), 19(c), 20, 21(a), 22(a) and 22(b) are schematic views explaining applications of a method for producing a light-emitting device of the present embodiment; FIGS. 18(a), 18(b) and 18(c) show examples of the cases wherein a side surface of a transparent resin is provided with a lead; FIGS. 19(a), 19(b) and 19(c) show examples of surface mounting of a light-emitting device shown in FIG. 18(c); FIG. 20 shows an application example of a shape of an element mounting part; FIGS. 21(a) and 21(b) show the cases wherein an element mounting part is flat; and FIG. 22 shows a constitution example of a through-hole surface mounting type light-emitting device.

In a light-emitting device shown by the present embodiment, for example, as shown in FIG. 9(a), the first lead 201 and the second lead 202 are exposed to the rear surface of a light emission surface of the transparent resin 4. Therefore when it is provided on a printed circuit board 6, a light emitting direction is limited to perpendicular to a surface mounting plane, as shown in FIG. 9(b).

In a method for producing a light-emitting device of the present embodiment, a pattern formed on the element mounting part 201A is accepted when the pattern satisfies at least the preferable conditions. Accordingly, folding parts 201Q and 202B, having the same width as the width of the transparent resin 4 for encapsulating, are provided in advance to the first lead 201 and the second lead 202 of the lead frame 2, as shown in FIG. 18(a), and in producing a discrete edge, the lead frame is cut so as to leave the folding parts 201Q and 202B, at the first lead side 201 and the second lead side 202. After a discrete device is produced, as shown in each of FIGS. 18(b) and 18(c), the folding parts 201Q and 202B of the first lead 201 and the second lead 202 are folded toward the side surfaces 4B and 4C of the transparent resin 4. And surface mounting on the printed circuit board 6 by using the first lead 201 and the second lead 202, which are exposed at a rear surface of a light emission surface, similarly as in the light-emitting device explained in the present embodiment, then light can be emitted perpendicular to a surface mounting plane of the printed circuit board 6 as shown in FIG. 19(a). And the device can also be surface mounted in an erected manner so that the bottom surface of the element mounting part 201A is perpendicular to the surface mounting plane of the printed circuit board 6, as shown in FIGS. 19(a) and 19(b), because the folding parts 201Q and 202B folded toward the side surface of the transparent resin 4, have approximately the same width as that of the transparent resin 4. In this way, light can be emitted parallel to the surface mounting plane of the printed circuit board 6. Therefore the light-emitting device can also be used, for example, as a signal-transmitting device of an optical circuit utilizing a light signal instead of an electrical signal.

In the lead frame 2 used in producing a light-emitting device of the present embodiment, the side surface of the element mounting part 201A formed into a cup-shape, is flat as shown in FIG. 4(b), when viewed in a radius direction. However, not limited to flat surface, the side surface can be a curved surface as shown in FIG. 20.

In a lead frame which is used when a light-emitting device is produced of the present embodiment, the element mounting part 201A is formed into a cup-shape, however, not limited to this shape, a lead frame 2 in which the element mounting part 201A is flat, may be used as shown in FIGS. 21(a) and 21(b). If the element mounting part 201A is formed into a cup-shape as in the light-emitting device explained in the present embodiment, light-collecting efficiency becomes high. Therefore, when it is used for applications such as a flash lamp and a backlight for a liquid crystal display, the element mounting part 201A preferably be formed into a cup-shape. On the other hand, in the case of a flat element mounting part 201A, light emitted from the side surface of the light-emitting layer 102 in a direction parallel to the joining surface of the element mounting part 201A, is emitted as it is from the side surface of the transparent resin 4. When the light-emitting device is used for applications such as lamps or illuminations, it is not necessary to form the element mounting part 201A into a cup-shape. Therefore, when the light-emitting device as shown in FIG. 21(b) is produced by using a lead frame as shown in FIG. 21(a), the same effect as by the light-emitting device explained in the present embodiment, can be obtained by applying a method explained in the present embodiment.

Figure 22:
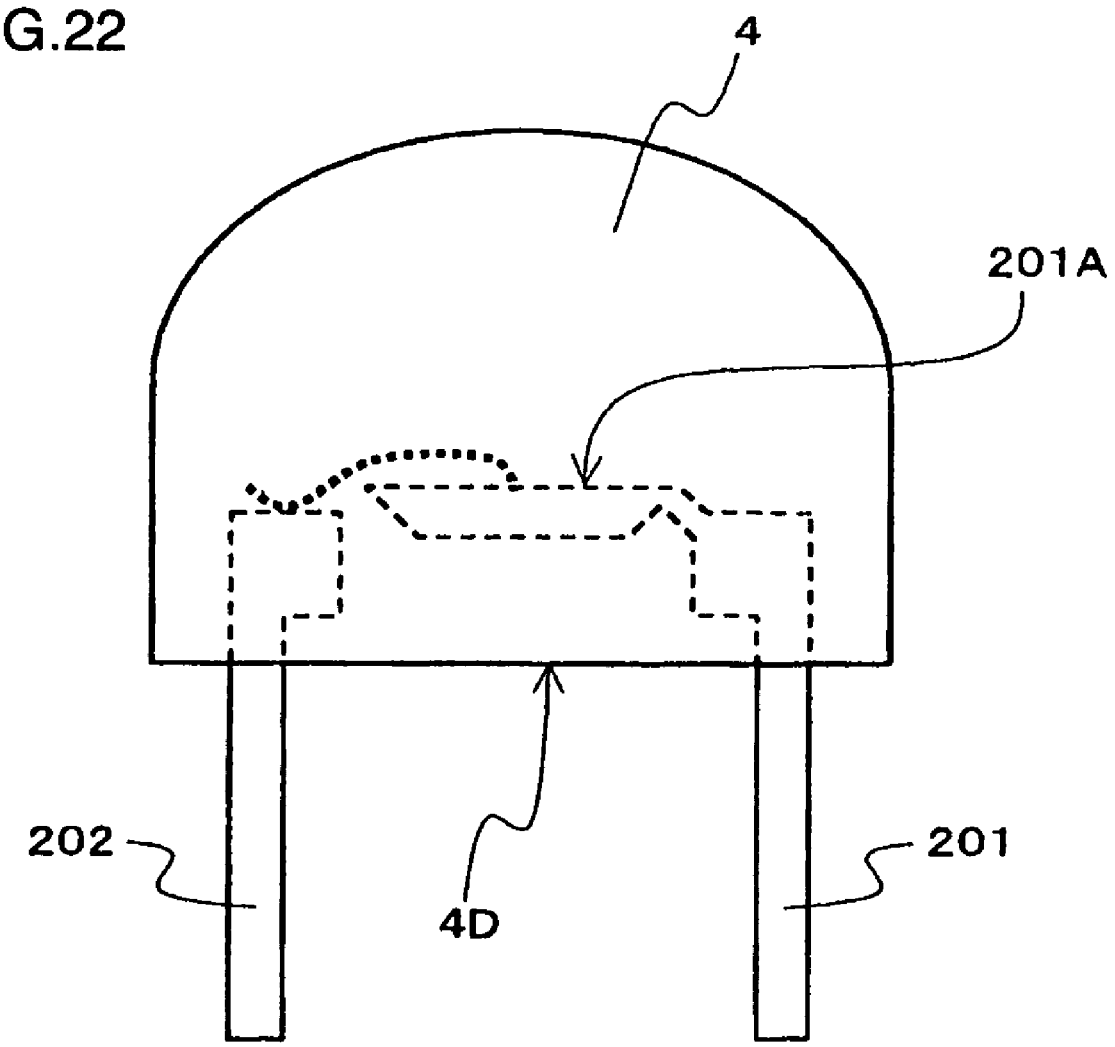
FIG. 22 is a schematic view explaining an application example of a method for producing a light-emitting device of the present embodiment, and showing an example of a constitution of a through-hole surface mounting type light-emitting device.

Thus far the explanation has been given for a surface mounting type light-emitting device as an example, however, a method for producing a light-emitting device of the present invention should not be limited to the surface mounting type light-emitting device, and can be applied, for example, in producing a through-hole surface mounting type light-emitting device, wherein the first lead 201 and the second lead 202 protrude from a lower surface 4D of a transparent resin 4 formed into a bullet-shape, as shown in FIG. 22.

The present invention is specifically explained based on the embodiment, the present invention is by no means limited to the embodiment, and may naturally be altered and/or modified variously without departing from the scope of the present invention.

INDUSTRIAL APPLICABILITY

As described above, a light-emitting device of the present invention reduces amount of the joining material flowing outside a joining area, and prevents the flown out joining material from climbing up along a side surface of an element, when connecting an electrode of a thin light-emitting layer provided on one main surface of a semiconductor substrate (element substrate), and a lead of a lead frame. The above-described light-emitting layer includes an n-type semiconductor layer and a p-type semiconductor layer. Therefore it is conceivable that the present invention is not limited to the above-described light-emitting element, and applicable also in producing a semiconductor device by using a semiconductor element with a similar constitution.

The invention claimed is:

1. A method for producing a light-emitting device comprising:
    a step of electrically connecting a first electrode provided on a light-emitting layer of a light-emitting element and a first lead of a lead frame so that the first electrode is opposite to an element mounting part of the first lead, wherein said light-emitting layer is provided on a main surface of a semiconductor substrate;
    a step of electrically connecting a second electrode provided on a rear surface of the semiconductor substrate, and a second lead of said lead frame;
    a step of forming a film of joining material made of an alloy or a single metal on the first electrode of said light-emitting element, in advance of the step of electrically connecting the first electrode and said first lead; and
    a step of forming a pattern on the element mounting part to reduce spreading of said joining material, in advance of the step of electrically connecting the first electrode of said light-emitting element and said first lead,
    wherein in the step of electrically connecting the first electrode and the first lead, the film of joining material is contacted with the element mounting part under conditions that a temperature of the element mounting part has been raised to not lower than a melting point of the film of joining material, and that a temperature of the light-emitting element is kept at not higher than the melting point of the film of joining material.

2. The method for producing the light-emitting device according to claim 1, wherein said film of joining material is formed by plating.

3. The method for producing the light-emitting device according to claim 1, wherein said film of joining material is made by forming said film of joining material molded in a thin film shape on said first electrode.

4. The method for producing the light-emitting device according to claim 1, wherein in cases where said light-emitting device is mounted on a printed circuit board by a solder joint material, said film of joining material is formed by a joining material having a melting point higher than a melting point of said solder joint material.

5. The method for producing the light-emitting device according to claim 1, wherein said film of joining material is formed by a gold-tin alloy.

6. The method for producing the light-emitting device according to claim 1, wherein a thickness of the light emitting layer of said light-emitting element is sufficiently smaller compared with a thickness of said semiconductor substrate.

7. The method for producing the light-emitting device according to claim 1, wherein said pattern consists of a pattern with a plurality of grooves crossing mutually inside a joining area on the element mounting part wherein the first electrode of said light-emitting element is placed.

8. The method for producing the light-emitting device according to claim 7, wherein said plurality of grooves extend outside said joining area, or crossing with other grooves extending outside said joining area.

9. The method for producing the light-emitting device according to claim 7, wherein a depth of said grooves or a height of said convex portions is larger than a thickness of the film of joining material formed on the first electrode of said light-emitting element.

10. The method for producing the light-emitting device according to claim 1, wherein said pattern consists of a pattern provided with a plurality of insular convex portions in a concave portion, the entire periphery of or a part of the periphery thereof being located outside said joining area.

11. The method for producing the light-emitting device according to claim 10, wherein the upper surfaces of said insular convex portions are flat.

12. The method for producing the light-emitting device according to claim 1, wherein in the step of forming the pattern to reduce spreading of said joining material, said pattern is formed on a surface of the element mounting part on which the light-emitting device is placed.

* * * * *